United States Patent
Ogura et al.

(10) Patent No.: US 11,605,734 B2
(45) Date of Patent: Mar. 14, 2023

(54) TRANSISTOR DEVICE HAVING A SOURCE REGION SEGMENTS AND BODY REGION SEGMENTS

(71) Applicant: SEMICONDUCTOR COMPONENTS INDUSTRIES, LLC, Phoenix, AZ (US)

(72) Inventors: Takashi Ogura, Oizumi-machi (JP); Takashi Hiroshima, Ota (JP); Toshimitsu Taniguchi, Aizuwakamatsu (JP); Peter A. Burke, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/452,095

(22) Filed: Oct. 25, 2021

(65) Prior Publication Data
US 2022/0045209 A1 Feb. 10, 2022

Related U.S. Application Data

(63) Continuation of application No. 16/512,854, filed on Jul. 16, 2019, now Pat. No. 11,158,734.
(Continued)

(51) Int. Cl.
*H01L 29/78* (2006.01)
*H01L 29/417* (2006.01)

(52) U.S. Cl.
CPC .... *H01L 29/7813* (2013.01); *H01L 29/41741* (2013.01); *H01L 29/7803* (2013.01); *H01L 29/7809* (2013.01)

(58) Field of Classification Search
CPC ........... H01L 29/7813; H01L 29/41741; H01L 29/7803; H01L 29/7809; H01L 29/0696;
(Continued)

(56) References Cited

U.S. PATENT DOCUMENTS

2010/0171173 A1 7/2010 Hsieh
2010/0176446 A1 7/2010 Hsieh
(Continued)

OTHER PUBLICATIONS

U.S. Appl. No. 16/512,854, filed Jul. 16, 2019, Allowed.

*Primary Examiner* — Jonathan Han
(74) *Attorney, Agent, or Firm* — Brake Hughes Bellermann LLP

(57) ABSTRACT

In one general aspect, an apparatus can include a first trench disposed in a semiconductor region and including a gate electrode and a second trench disposed in the semiconductor region. The apparatus can include a mesa region disposed between the first trench and the second trench. The apparatus can include a source region segment of a first conductivity type disposed in a first side of the mesa region where the source region segment is included in a plurality of source region segments and where the plurality of source region segments are aligned along the longitudinal axis. The apparatus can include a body region segment of a second conductivity type disposed in a second side of the mesa region opposite the first side of the mesa region and having a portion disposed above the source region segment where the body region segment is included in a plurality of body region segments.

20 Claims, 22 Drawing Sheets

Related U.S. Application Data

(60) Provisional application No. 62/826,736, filed on Mar. 29, 2019.

(58) Field of Classification Search
CPC ............. H01L 29/0865; H01L 29/1095; H01L 29/41766; H01L 29/1025; H01L 29/0847; H01L 29/66477; H01L 29/78
See application file for complete search history.

(56) References Cited

U.S. PATENT DOCUMENTS

| | | | |
|---|---|---|---|
| 2011/0068389 A1 | 3/2011 | Hsieh | |
| 2017/0040423 A1* | 2/2017 | Inoue | H01L 29/78 |
| 2017/0047316 A1* | 2/2017 | Katou | H01L 27/0211 |
| 2017/0317207 A1* | 11/2017 | Hsieh | H01L 29/7811 |
| 2018/0145137 A1* | 5/2018 | Yamamoto | H01L 29/0623 |

* cited by examiner

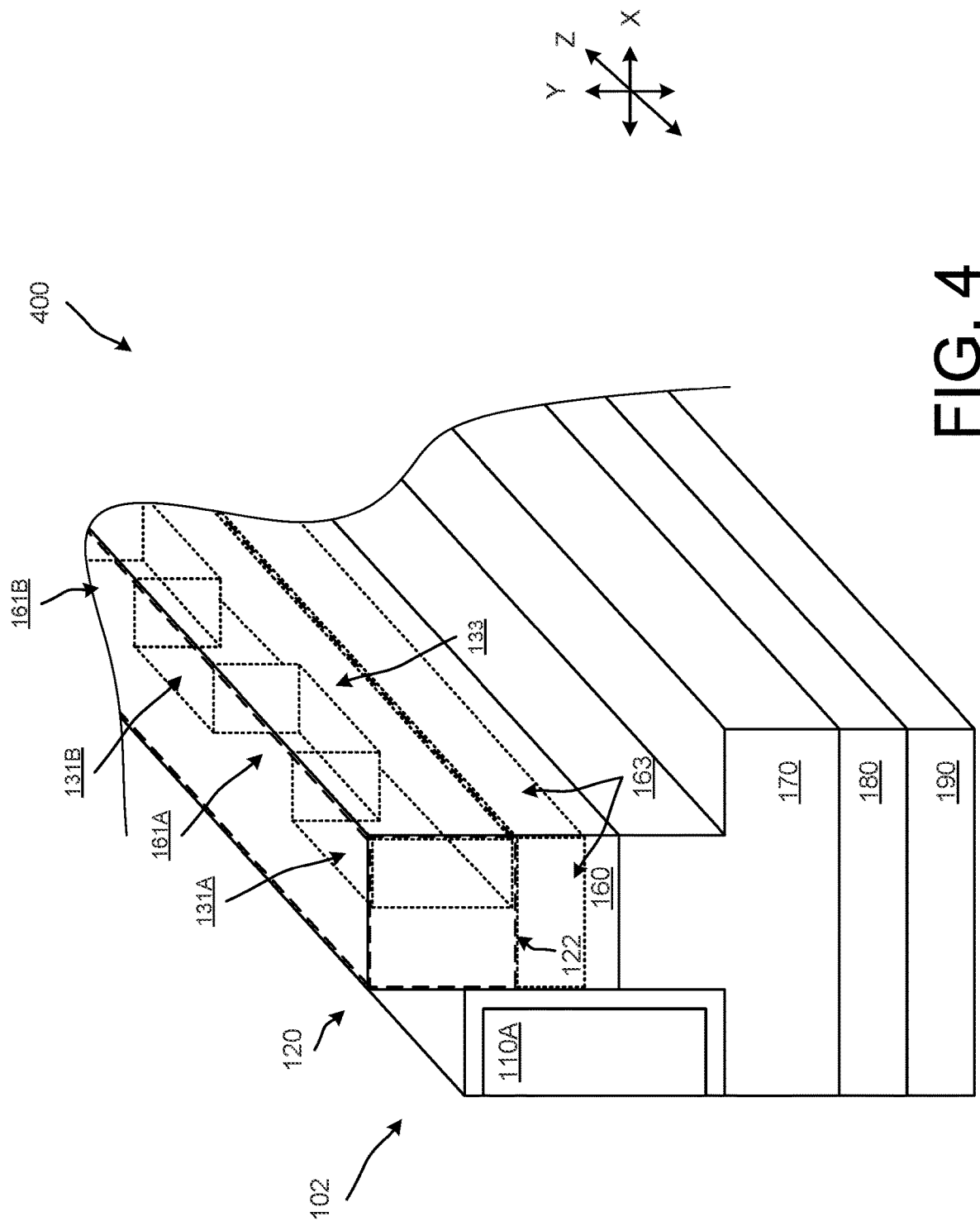

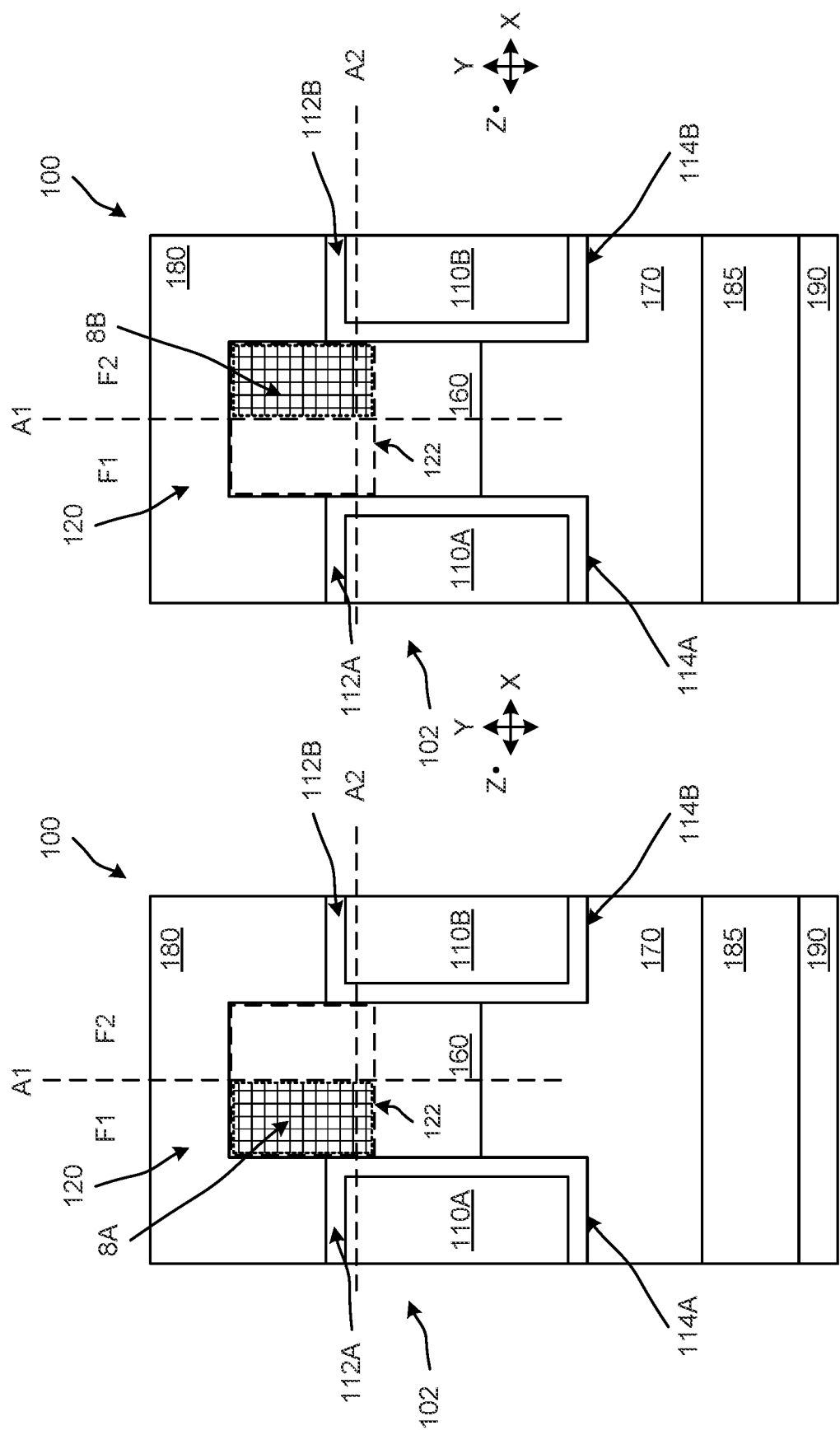

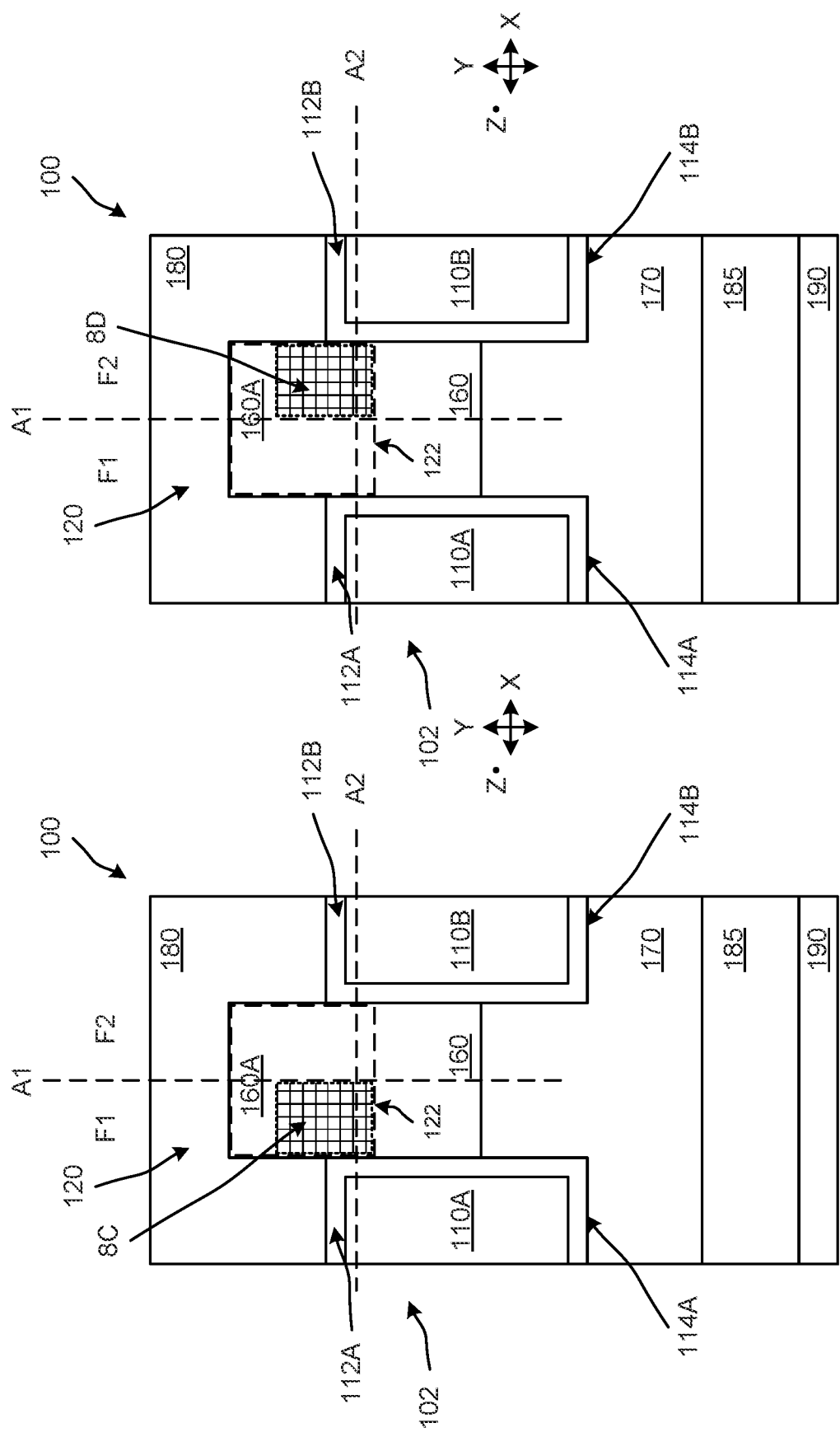

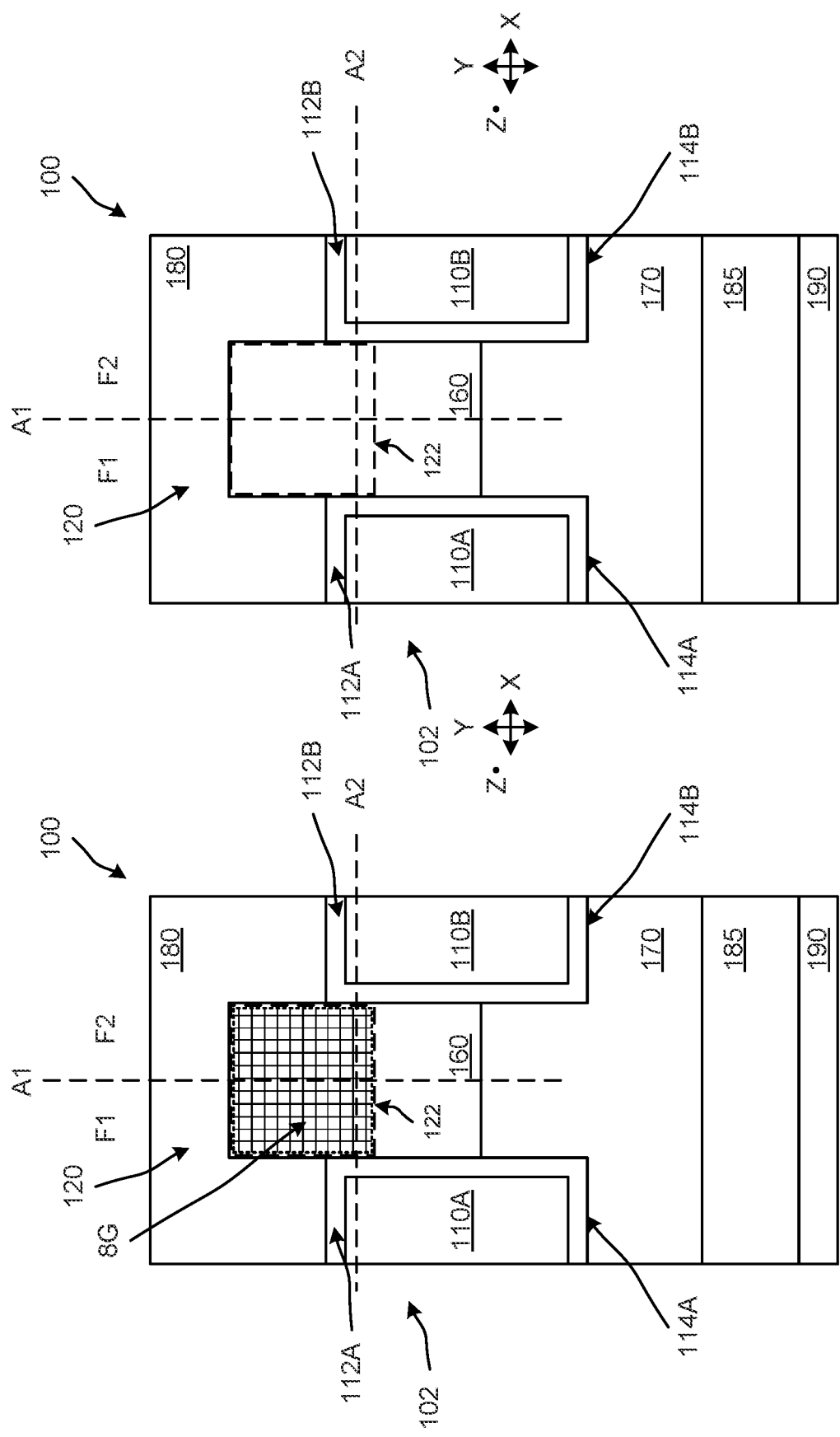

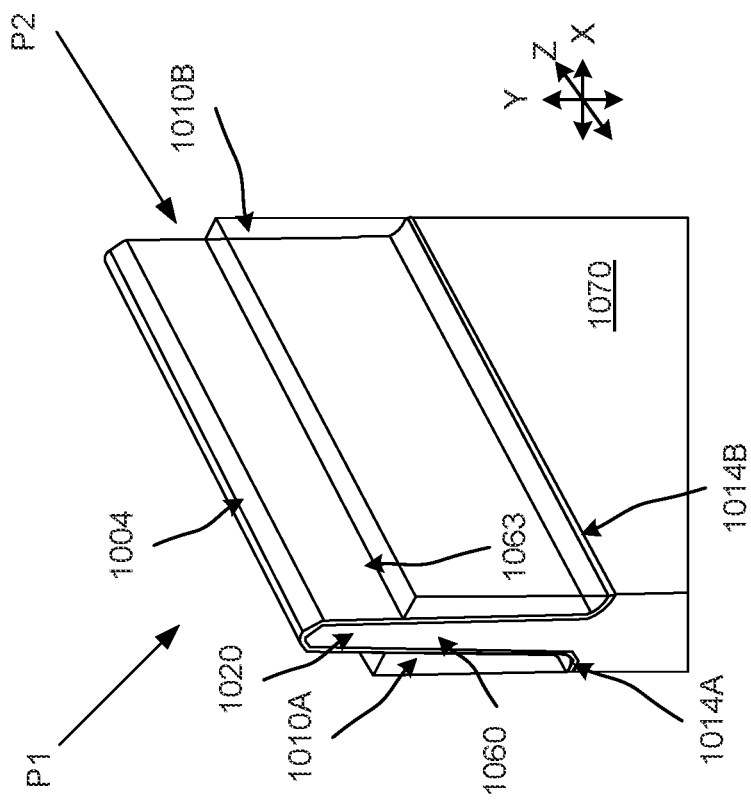
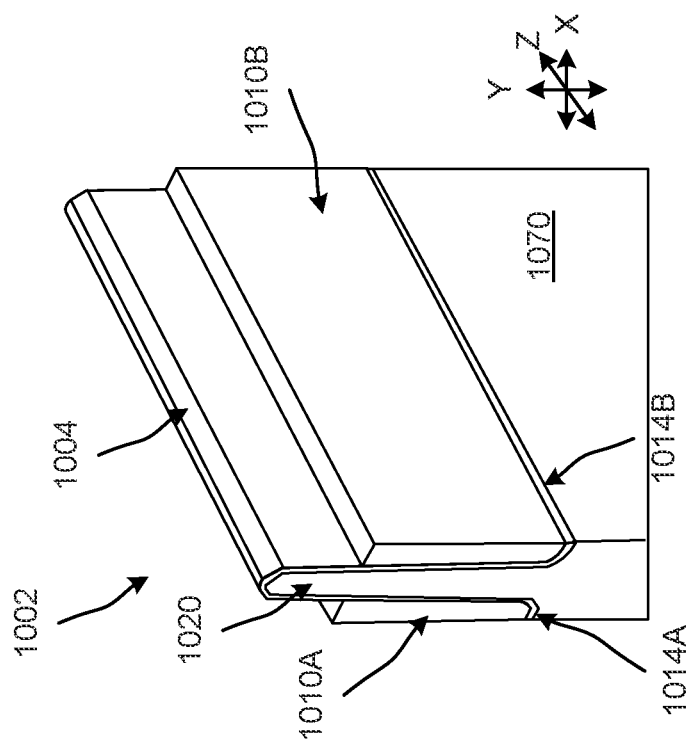
FIG. 10B
FIG. 10A

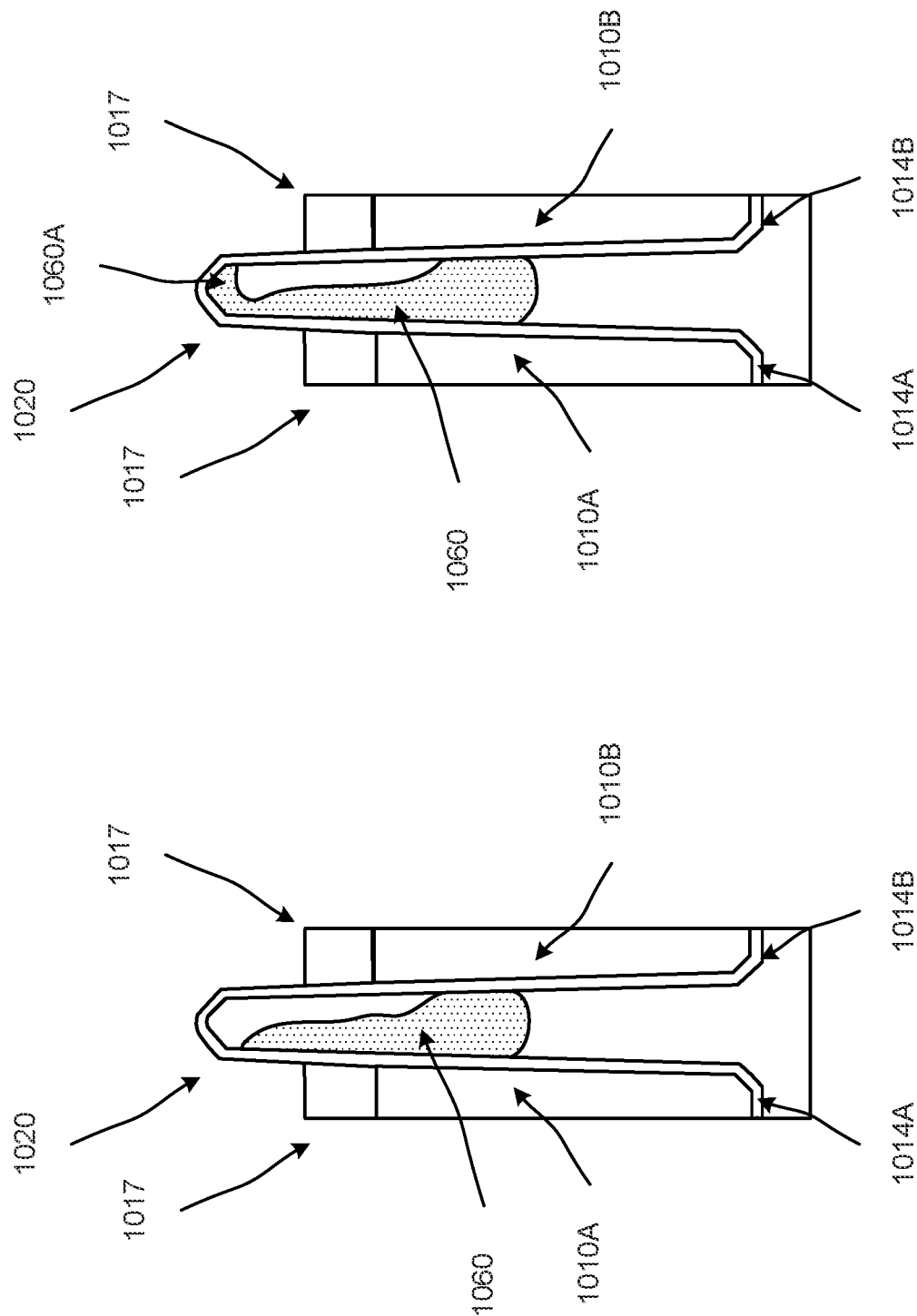

TRANSISTOR DEVICE HAVING A SOURCE REGION SEGMENTS AND BODY REGION SEGMENTS

RELATED APPLICATIONS

This application claims priority to and is a continuation of U.S. application Ser. No. 16/512,854, filed Jul. 16, 2019, which claims priority to the and benefit of U.S. Provisional Application No. 62/826,736, filed Mar. 29, 2019, all of which are incorporated by reference herein in their entireties.

TECHNICAL FIELD

This description relates to a transistor device having source region segments and body region segments.

BACKGROUND

Some transistor devices may be subject to, for example, a parasitic bipolar transistor that can be triggered and can prevent turn-off of the transistor device. The parasitic bipolar transistor can be triggered by self-biasing in the base of the parasitic bipolar transistor due to substrate current. Thus, a need exists for systems, methods, and apparatus to address the shortfalls of present technology and to provide other new and innovative features.

SUMMARY

In at least one general aspect, an apparatus can include a first trench disposed in a semiconductor region and including a gate electrode, and a second trench disposed in the semiconductor region. The apparatus can include a mesa region disposed between the first trench and the second trench, and a source region of a first conductivity type disposed in a top portion of the mesa region. The apparatus includes a plurality of body region segments of a second conductivity type disposed in the side of the mesa region. The plurality of body region segments define an alternating pattern with the plurality of source region segments along the side of the mesa region.

The details of one or more implementations are set forth in the accompanying drawings and the description below. Other features will be apparent from the description and drawings, and from the claims.

BRIEF DESCRIPTION OF THE DRAWINGS

FIG. 4 illustrates a perspective view of another transistor that is a variation of the transistors shown in FIGS. 1 and 2.

FIGS. 8A through 8H illustrate various cross sections of the upper region of the mesa region that can be combined along a longitudinal axis in accordance with variations of the transistor shown in at least FIG. 1.

FIGS. 10A through 10H are diagrams that illustrate a process of making one or more of the transistors as described herein.

DETAILED DESCRIPTION

Figure 1:
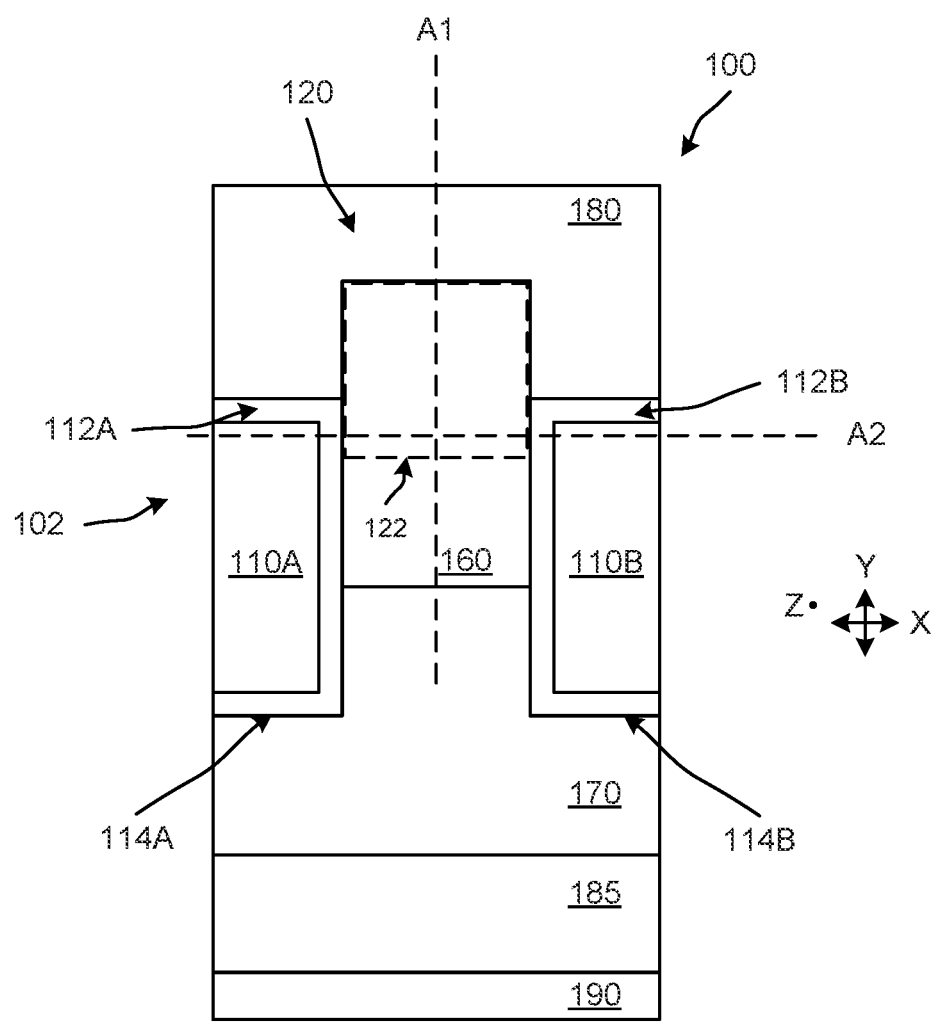
FIG. 1 is a diagram that illustrates a cross-sectional view of a transistor, according to an implementation.

The transistors described here can have body region segments and source region segments defined so that a parasitic bipolar device (e.g., NPN bipolar transistor device) included within the transistor is prevented from being activated in an undesirable fashion. Specifically, a transistor structure, as described herein, can be configured to prevent turn-on of a parasitic bipolar device included in the transistor structure when the transistor structure is being turned-off. The activation of the parasitic bipolar device can be referred to as latch-up and can be triggered in response to self-biasing of the base in the parasitic bipolar device in response to a substrate current. The transistor devices described herein can be configured with structures that reduce the base resistance while maintaining a desirable on-resistance. Thus reducing, or eliminating, undesirable latch-up conditions associated with a parasitic bipolar device when the transistor structure is being turned-off.

For example, at least one side of a mesa region of a transistor, as described herein, can have source region segments of a first conductivity type alternating with body region segments of a second conductivity type. As a specific example, in a trench metal-oxide-semiconductor field effect transistor (MOSFET) device, a side and upper surface of a silicon mesa (mesa top and mesa sidewall) can have a N-type conductivity source region segments alternating with P-type conductivity body region segments. The N-type conductivity source region segments and P-type conductivity body region segments can be disposed above a P-type channel region. The P-type channel region can be in contact with the P-type conductivity body region segments. This structure within the transistor, for example, can be used to reduce base resistance while maintaining a desirable on-resistance of the transistor. Accordingly, undesirable latch-up conditions associated with a potential parasitic bipolar device can be reduced, or eliminated, when the transistor is being changed to an off state.

The channel and mesa top of a conventional structure can be connected by a P-type high concentration body layer that does not operate in a desirable fashion as a channel. Therefore, when trying to reduce the body, in order to reduce the base resistance, the effective channel area is decreased. In contrast, transistors with the body region segments and source region segments described herein can have discontinuous body region segments without affecting, in an adverse fashion, performance in the channel region. The transistors described herein are configured to prevent parasitic bipolar device turn-on by, for example, reducing the base resistance of the parasitic device without channel area penalty (e.g., reduced channel area). The transistor configurations described herein can resolve latch-up conditions while having a desirable on resistance (Ron), which can be problematic in other transistor designs. The transistor configurations described herein can minimize (e.g., reduce) mesa width and can minimize (e.g., reduce) potential Ron*area penalties.

FIG. 1 is a diagram that illustrates a cross-sectional view of a transistor 100 (e.g., vertical transistor device, MOSFET device), according to an implementation. The transistor 100 shown in FIG. 1 has a mesa region 120 (also can be referred to as a mesa) disposed between a pair of trenches 114A, 114B formed in (e.g., defined within) a semiconductor region 102. The mesa 120 (or sidewalls thereof) can be defined, at least in part by, the pair of trenches 114A, 114B. Each of the trenches 114A, 114B, respectively, includes an electrode 110A, 110B (e.g., a gate electrode) insulated, respectively, by a dielectric layers 112A, 112B.

The mesa 120 includes an upper region 122 (of the mesa region 120), a body region 160, and at least a portion of an epitaxial layer 170. At least a portion of the upper region 122 can include one or more source region segments, which are not shown in FIG. 1. The upper region 122 can also include one or more body region segments coupled to the body region 160, which are not shown in FIG. 1.

The one or more source region segments in the upper region 122 and the epitaxial layer 170 can each be of a first conductivity type. The body region 160, which is disposed between (e.g., disposed vertically between) (or around) one or more source region segments in the upper region 122 and the epitaxial layer 170, is of a second conductivity type. The first conductivity type is opposite that of the second conductivity type. In some implementations, the transistor 100 (and other transistors disclosed herein) can be associated with only a few unit cells. In some implementations, the first conductivity type can be an N-type conductivity (e.g., an N-type dopant (e.g., phosphorus (P), arsenic (As), antimony (Sb))) and the second conductivity type can be a P-type conductivity (e.g., a P-type dopant (e.g., boron (B), aluminum (Al), gallium (Ga))). In some implementations, the first conductivity type can be a P-type conductivity and the second conductivity type can be an N-type conductivity. The examples and associated conductivity types described herein, although discussed as being associated with a particular type of dopant, can be reversed to form different devices (e.g., P-channel devices, N-channel devices).

A channel (or channels) can be defined within the body region 160 when the transistor 100 is in an on-state (based on an applied voltage to the electrodes 110A, 110B). Current can flow between the source conductor 180 and the drain conductor 190 when the transistor 100 is in an on-state.

A source conductor 180 is in contact with one or more source region segments included in the upper region 122. The source conductor 180 is insulated from the electrodes 110A, 110B by the respective dielectric layers 112A, 112B. The epitaxial layer 170 can be disposed on a substrate 185, and a drain conductor 190 can be in contact with the substrate 185. The vertical direction (which is the depth direction or the height direction) in this implementation is aligned along the y-axis. The horizontal direction (which is the width direction or the lateral direction) in this implementation is aligned along the x-axis. The length direction in this implementation is aligned along the z-axis. The mesa region 120 can be longitudinally aligned along the z-axis. As oriented in FIG. 1, a top of the transistor 100 can be towards the source portion (e.g., source region segment(s) in the upper region 122, source conductor 180), and a bottom of the transistor 100 can be towards the drain portion (e.g., drain conductor 190).

As noted above, the upper region 122 of the mesa region 120 can include one or more source region segments, and the upper region 122 can also include one or more body region segments. The one or more body region segments can be connected with (e.g., contiguous with, in contact with) the body region 160 (and/or a channel region thereof). The one or more body region segments (although of opposite conductivity type) can be in contact with (and can define PN junctions with) the one or more source regions. In some implementations, body region segments can be interleaved with (e.g., can be disposed between) source region segments. Such an example implementation is shown in FIG. 2.

In some implementations, a surface area (or volume) of the body region 160 (and body region segments) can be less than a surface area of (or volume) source region segments within the mesa region 120. In some implementations, over a longitudinal length of the mesa region 120 including an equal number of body region segments and source region segments, a surface area (or volume) of the body region 160 (and body region segments) can be less than a surface area of (or volume) source region segments within the mesa region 120.

In this implementation, the mesa region 120 is aligned along a vertical axis A1 (or plane). The vertical axis A1 intersects (in order from top to bottom) the upper region 122, the body region 160 (which is below the upper region 122), and the epitaxial layer 170. As shown in FIG. 1, a horizontal axis A2 (or plane) intersects the electrodes 110A, 110B (and dielectric layers 112A, 112B) and the upper region 122. The horizontal axis A2 is orthogonal to the vertical axis A1 and is aligned parallel to the top surface of the mesa region 120 and the x-axis. The vertical axis A1 and the horizontal axis A2 are orthogonal to a longitudinal axis aligned along the z direction. In some implementations, the top surface of the mesa region 120 is also disposed above (e.g., vertically above) a top surface of each of the electrodes 110A, 110B and the dielectric layers 112A, 112B.

Figure 2:
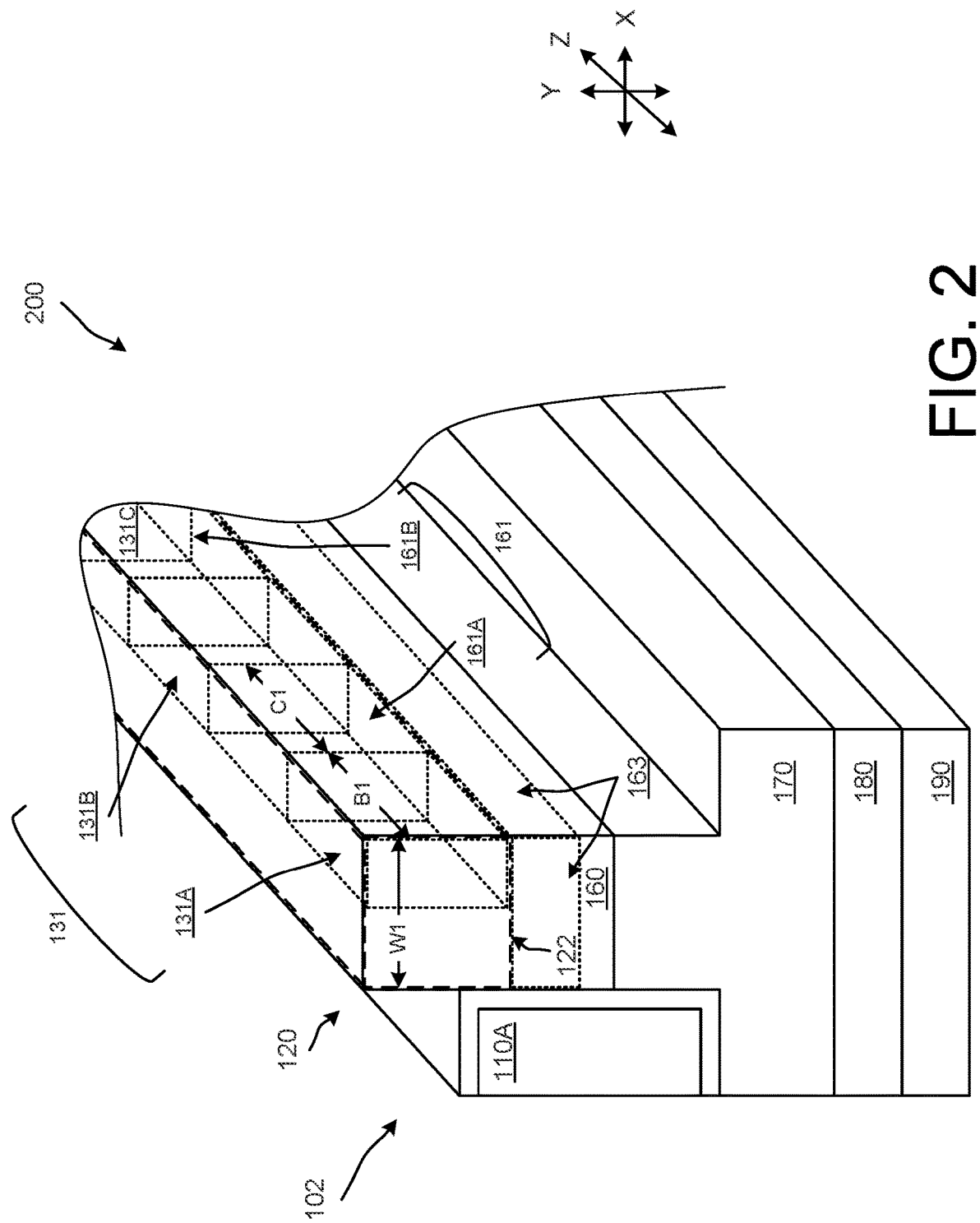
FIG. 2 illustrates a perspective view of a transistor that is a variation of the transistor shown in FIG. 1.

FIG. 2 illustrates a perspective view of a transistor 200 that is a variation of the transistor 100. Trench 114B (including electrode 110B and dielectric 112B) is omitted from this view so that the mesa region 120 can be more visible.

As shown in FIG. 2, a semiconductor region 102 of the transistor 100 has source region segments 131A, 131B, 131C (which can collectively be referred to source reason segments 131) interleaved with (also can be referred to as alternating with) body region segments 161A, 161B (which can collectively be referred to as body region segments 161). Specifically, the source region segments 131 and the body region segments 161 are included in the upper region 122 of the transistor 200.

As shown in FIG. 2, the body region segments 161 are in contact with a channel region 163. The body region segments 161 and the channel region 163 can have the same conductivity type. The body region segments 161 and the channel region 163 can have the same conductivity type as the body region 160. In this implementation, the source region segments 131 have a conductivity type opposite that of the body region segments 161.

As shown in FIG. 2, the upper region 122 of the mesa region 120 can be longitudinally aligned along the z-axis.

Accordingly, the source region segments 131 and the body region segments 161 can also be longitudinally aligned along the z-axis.

Source region segments 131 and the body region segments 161 are disposed on one side of the upper region 122 of the mesa region 120. In this implementation, the source region segments 131 and the body region segments 161 define one-half (e.g., approximately one-half) of a cross-sectional surface area (e.g., a cross-sectional surface area normal to the longitudinal direction along the z-axis) of the upper region 122 of the mesa region 120. In other words, the source region segments 131 have a cross-sectional width (along the x-axis) that is one-half of a width of the upper region 122 of the mesa region 120. In some implementations, a cross-sectional surface area of the source region segments 131 and/or the body region segments 161 can be less than or greater than one-half of the upper region 122 of the mesa region 120. In other words, the source region segments 131 and/or the body region segments 161 have cross-sectional widths that are less than or greater than one-half of the width of the upper region 122 of the mesa region 120.

As shown in FIG. 2, the source region segments 131 have a length B1 and the body region segments 161 have a length C1. In some implementations, the length B1 of the source region segments 131 can be the same as the length C1 of the body region segments 161. In some implementations, the length B1 of the source region segments 131 can be longer or shorter than the length C1 of the body region segments 161. In some implementations, the length of B1 can be between 0.2 μm and 0.9 μm (e.g., 0.3 μm). In some implementations, the length of C1 can be between 0.2 μm and 0.9 μm (e.g., 0.3 μm). In some implementations, the mesa width W1 can be between, for example, 80 nm and 180 nm. In some implementations, the mesa width W1 can be between 0.09 μm to 0.13 μm (e.g., 0.11 μm). Accordingly, the ratio of W1/B1 and/or W1/C1 can be between approximately 0.1 to 0.6. In some implementations, a cell pitch between mesa regions 120 can be approximately 0.3 μm to 0.5 μm (e.g., 0.38 μm). In some implementations, the source width can be approximately half of the mesa width W1.

Because the body region 160, and the channel region 163 and the upper region 122 of the mesa region 120, are all of the same conductivity type, the source region segments 131 can be implanted into the upper region 122 of the mesa region 120 to define the body region segments 161. The process of forming the source region segments 131 and the body region segments 161 are discussed in more detail below.

In order to prevent parasitic NPN turn-on, the body region segments 161 are formed discontinuously and the base resistance of the NPN is controlled by arranging the body region segments 161 alternately with the source region segments 131 along the mesa region 120. The configuration shown in FIG. 2, can focus on enhancing the on resistance characteristics, and the alternating source region segments 131 and the body region segments 161 are aligned on only one side along the mesa region 120.

Figure 3:
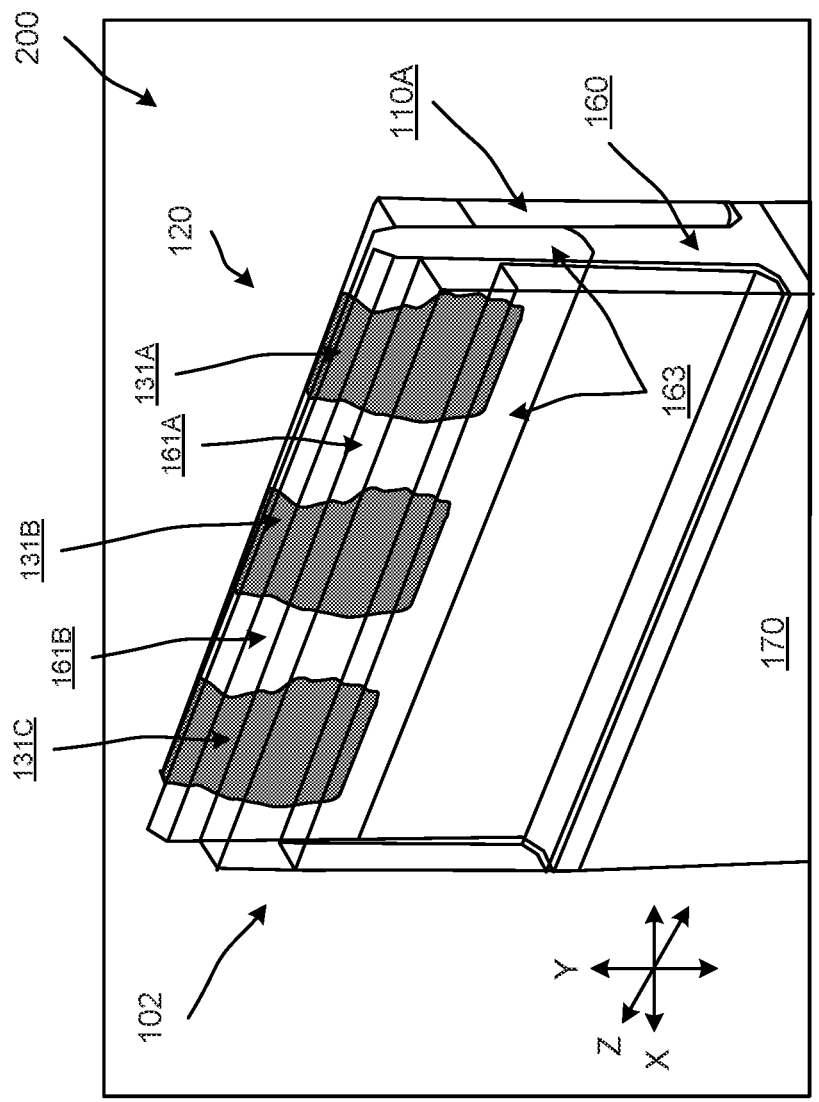
FIG. 3 is a diagram that illustrates an implementation of the transistor shown in at least FIGS. 1 and 2.

FIG. 3 is a diagram that illustrates an implementation of the transistor 200 shown in at least FIGS. 1 and 2. As shown in FIG. 3, the transistor 200 includes source region segments 131 and body region segments 161.

FIG. 4 illustrates a perspective view of another transistor 400 that is a variation of the transistors shown in FIGS. 1 and 2. This transistor 400 variation can be referred to as a single-sided body transistor. In some implementations, a continuous source region 133 is connected to (e.g., coupled to, electrically coupled to, contiguous with) each of the source region segments 131. The continuous source region 133 has the same conductivity type as the source region segments 131. In some implementations, the continuous source region 133 is aligned along the channel region 163. In some implementations, the continuous source region 133 is aligned along the longitudinal z-axis. In some implementations, the continuous source region 133 is disposed below the body region segments 161. In some implementation, the continuous source region 133 is disposed between channel region 163 and the body region segments 161.

In some implementations, the continuous source region 133 has a length greater than a length of one or more of the source region segments 131. In some implementations, the continuous source region 133 spans (along the longitudinal direction) more than two of the source region segments 131. In some implementations, the continuous source region 133 spans more than three of the source region segments 131.

Figure 5A:
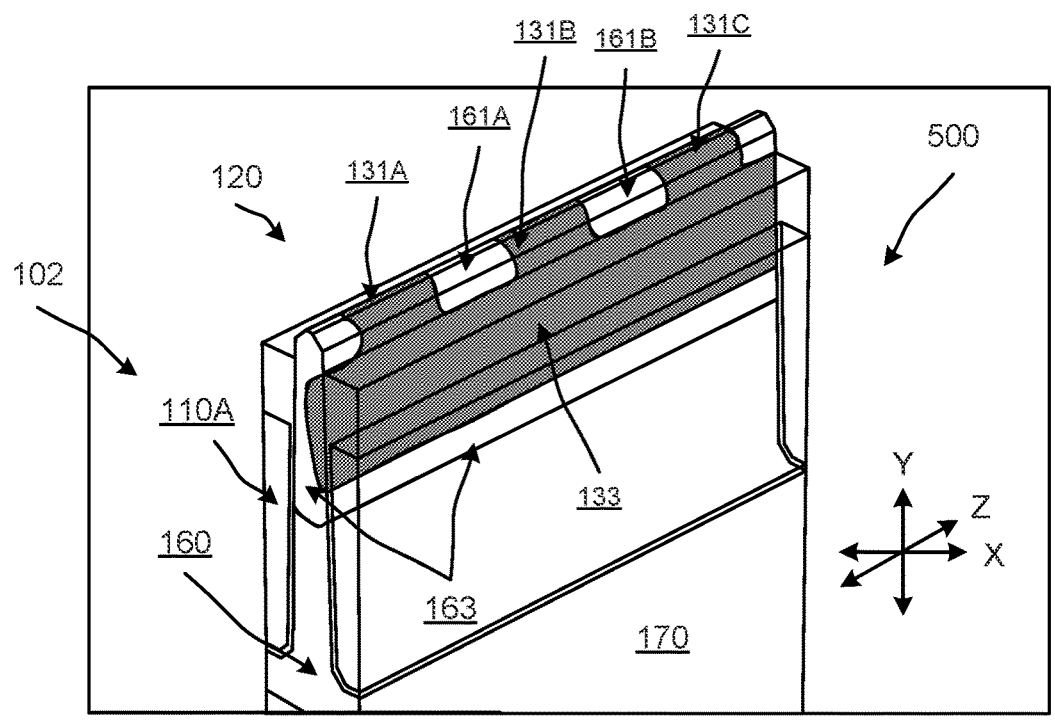
FIGS. 5A and 5B are diagrams that illustrate a transistor implementation of the transistors shown in at least FIGS. 1 and 4.
Figure 5B:
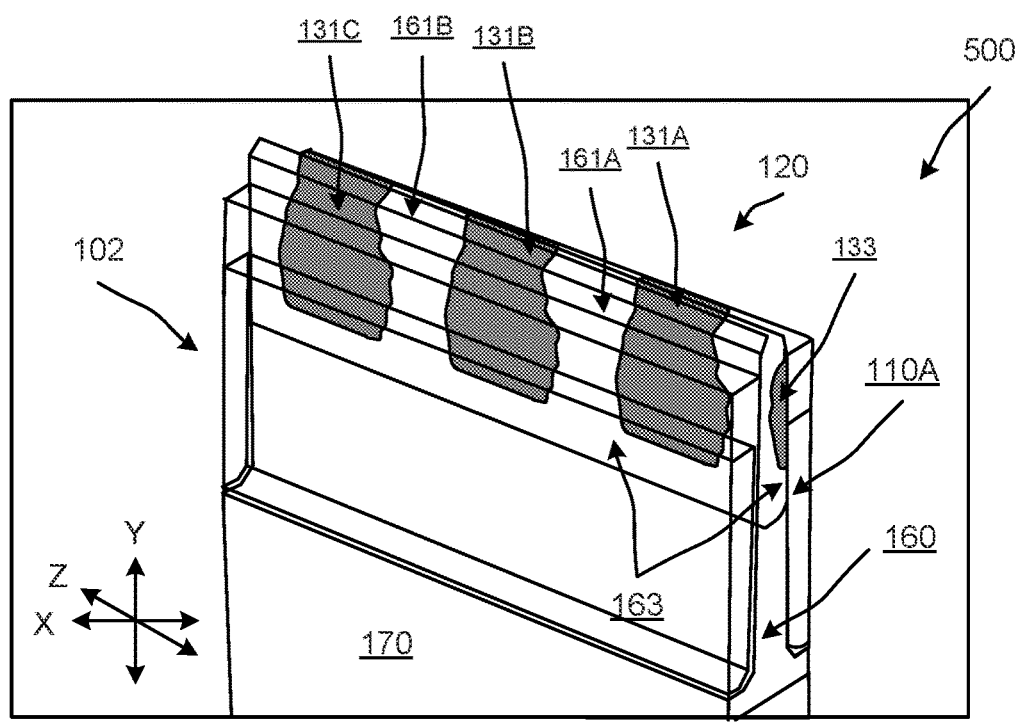

FIGS. 5A and 5B are diagrams that illustrate a transistor 500 implementation of the transistors shown in at least FIGS. 1 and 4. As shown in FIGS. 5A and 5B, the transistor 500 includes a continuous source region 133 that is coupled with the source region segments 131.

Figure 6:
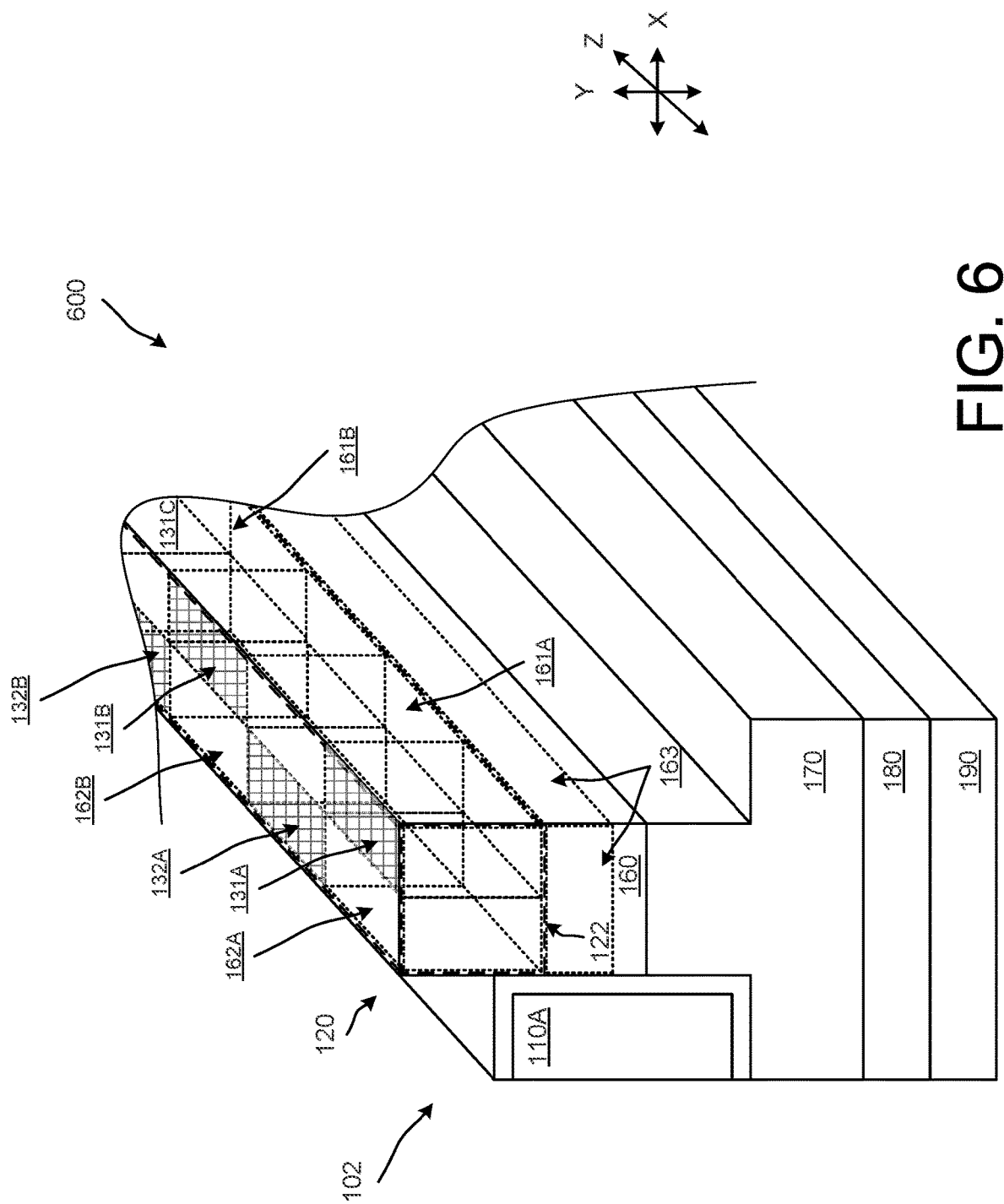
FIG. 6 illustrates a perspective view of another transistor that is a variation of the transistor shown in FIG. 1.

FIG. 6 illustrates a perspective view of another transistor 600 that is a variation of the transistor shown in FIG. 1. This transistor 600 variation can be referred to as a double-sided body transistor. Trench 114B (including electrode 110B and dielectric 112B) is omitted from this view so that the mesa region 120 can be more visible.

As shown in FIG. 6, a semiconductor region 102 of the transistor 100 has source region segments 131A, 131B, 131C, 132A, 132B (which can collectively be referred to source reason segments 131, 132) interleaved with (also can be referred to as alternating with) body region segments 161A, 161B, 162A, 162B (which can collectively be referred to as body region segments 161, 162). The top surfaces of the source region segments 131, 132 are shown with a hashed surface so that they can be more readily distinguished from the body region segments 161, 162.

As shown in FIG. 6, the source region segments 131 are interleaved with the body region segments 161 on a first side of the mesa region 120, and the source region segments 132 are interleaved with the body region segments 162 on a second side of the mesa region 120. The source region segments 131 are offset along the longitudinal z-axis relative to the source region segments 132. Similarly, the body region segments 161 are offset along the longitudinal z-axis relative to the body region segments 162. In this implementation, the source region segments 131, 132 and the body region segments 161, 162 define a checkerboard (e.g., periodic, periodic alternating) pattern when viewed from above (along the y direction).

In order to at least prevent parasitic NPN turn-on, the p-type body segments 161, 162 are formed discontinuously and the base resistance of the NPN is controlled by arranging them alternately with the source region segments 131, 132 along the mesa region 120 in a checkerboard pattern.

Figure 7B:
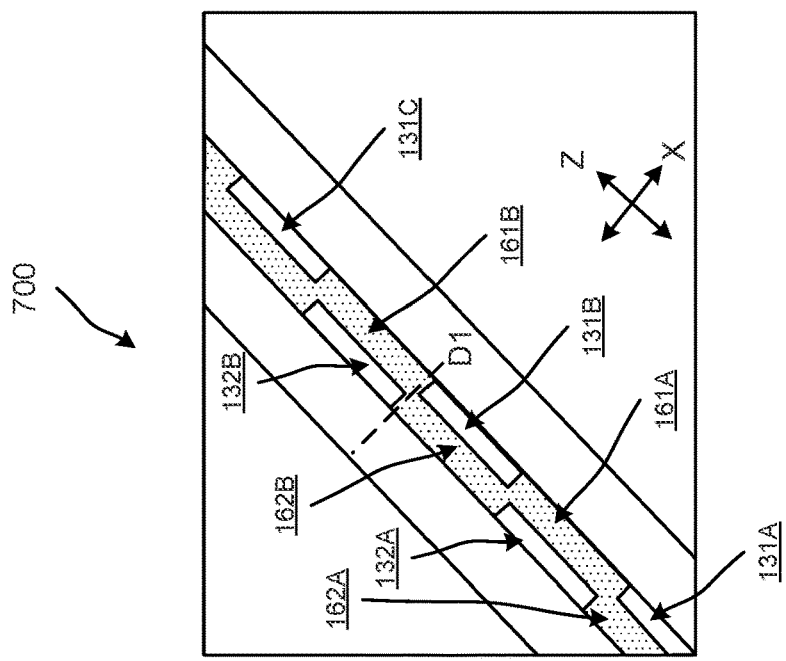
FIGS. 7A and 7E are diagrams that illustrate a transistor implementation of the transistors shown in at least FIGS. 1 and 6.
Figure 7A:
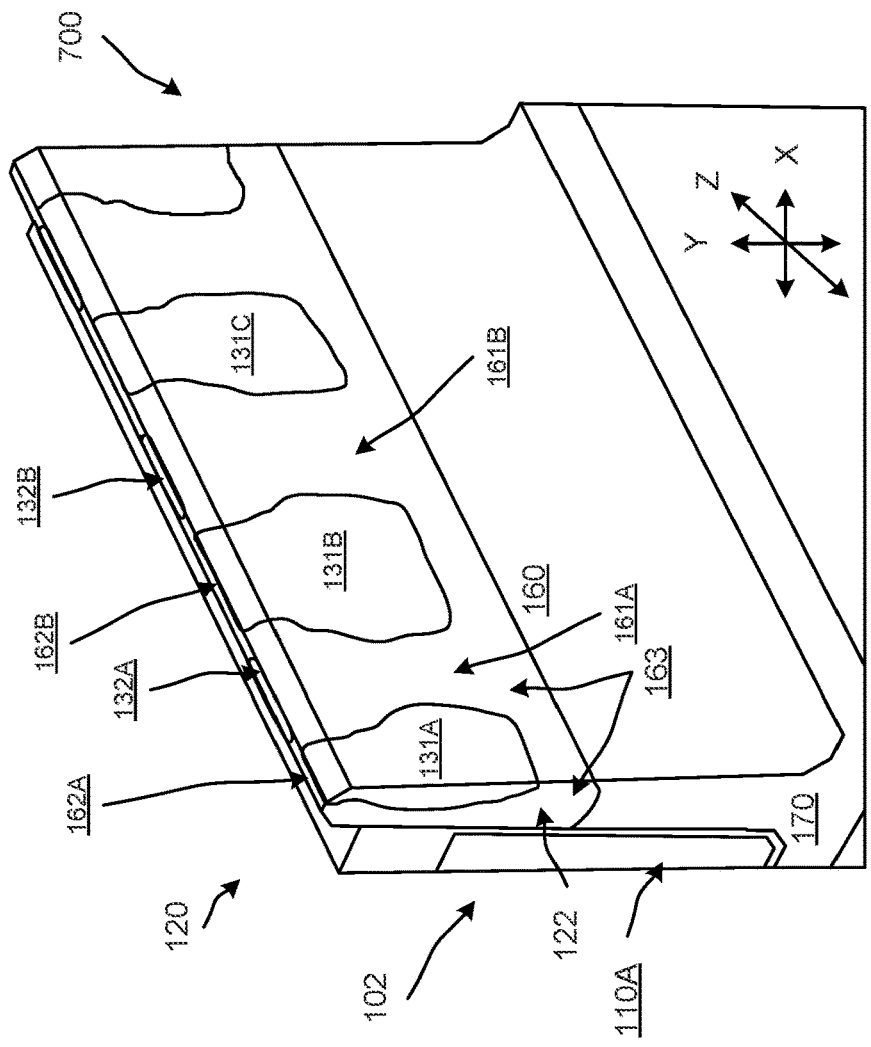

FIGS. 7A and 7B are diagrams that illustrate a transistor 700 implementation of the transistors shown in at least FIGS. 1 and 6. As shown in FIG. 7, the source region segments 131 are interleaved with the body region segments 161 on a first side of the mesa region 120, and the source region segments 132 are interleaved with the body region segments 162 on a second side of the mesa region 120. The source region segments 131 are offset along the longitudinal z-axis relative to the source region segments 132. Similarly, the body region segments 161 are offset along the longitudinal z-axis relative to the body region segments 162. In this implementation, the source region segments 131, 132 and the body region segments 161, 162 define a checkerboard pattern when viewed from above (along the y direction).

In this transistor 700 shown in FIG. 7B, the source region segments 131, 132 are separated by a separation area of the source region segments 131, 132. The separation area is of conductivity type opposite that of the source region segments 131, 132 and the same as that of the body region segments 161, 162. The separation area is aligned along line D1 between source region segments 131B, 132B. In some implementations, the separation area can have a width (a width orthogonal to the line D1) of less than a micron (e.g., a fraction of a micron, less than 0.1 microns). As mentioned previously, the source width (e.g., widths of 131B, 132B) can be approximately half of the mesa width W1.

Figure 7E:
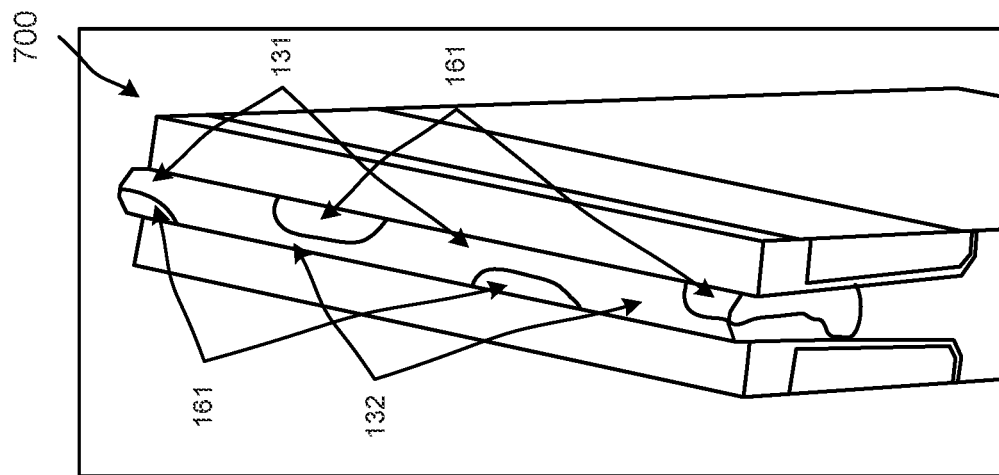
Figure 7D:
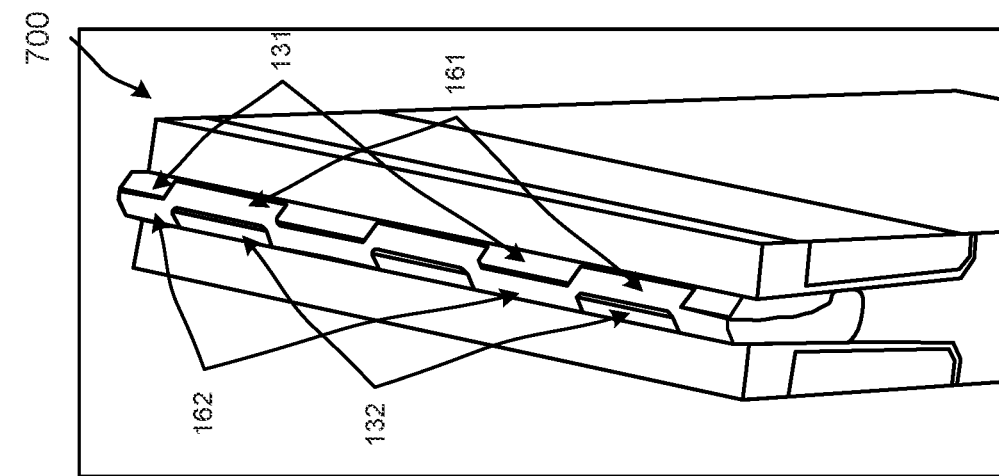
Figure 7C:
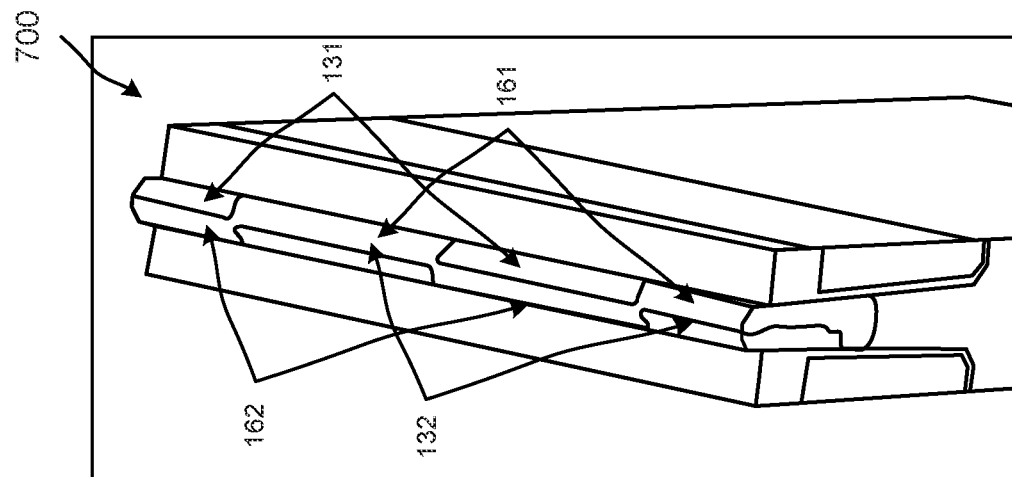

FIG. 7C through 7E are diagrams that illustrate other examples of checkerboard patterned body region segments 161, 162 and source region segments 131, 132.

More source region segments 131 and/or body region segments 161 can be included than shown in FIGS. 1 through 7B. More variations of cross sections that can be included along the longitudinal axis are shown and described in at least FIGS. 8A through 8H below.

FIGS. 8A through 8H illustrate various cross sections of the upper region 122 of the mesa region 120 that can be combined along a longitudinal axis (z axis) in accordance with variations of the transistor 100 shown in at least FIG. 1. FIGS. 8A through 8G illustrate source region segments 8A through 8G associated, respectively, with FIGS. 8A through 8G with hashed areas. The cross sections can be identified based on the cross-section label. For example, the cross section (and specifically the source region area) in FIG. 8A can be referred to as cross section 8A. In this implementation, the source region segments 8A through 8H will be assumed to have a first conductivity type and the body region 160 (and associated body region segments) will be assumed to have a second conductivity type. The features of the cross sections are described below.

FIG. 8A illustrates a cross section of the upper region 122 that includes the source segment 8A on side F1 (e.g., left side of line A1) of the upper region 122. FIG. 8B illustrates a cross section of the upper region 122 that includes the source segment 8A on side F2 (e.g., right side of line A1) of the upper region 122.

FIG. 8C illustrates a cross section of the upper region 122 where the source region segment 8C is on side F1 (e.g., left side of line A1) of the upper region 122. The source region segment 8C does not extend to a top surface of the mesa region 120 so that a portion 160A of the second conductivity type of the body region 160 is disposed between a top surface of the source region segment 8C and the top surface of the mesa region 122. The portion 160A of the body region 160 is disposed between the top surface of the source region segment 8C and the top surface of the mesa region 122 can function as an enhanced body contact area. FIG. 8D illustrates a cross section of the upper region 122 that includes the source region segment 8D, which is a version of the source region segment 8C mirrored onto the side F2 (e.g., left side of line A1) of the upper region 122. The cross sections shown in FIGS. 8C and 8D can be used as (e.g., referred to as) enhanced body contact cross sections.

Figures 8E, 8F:
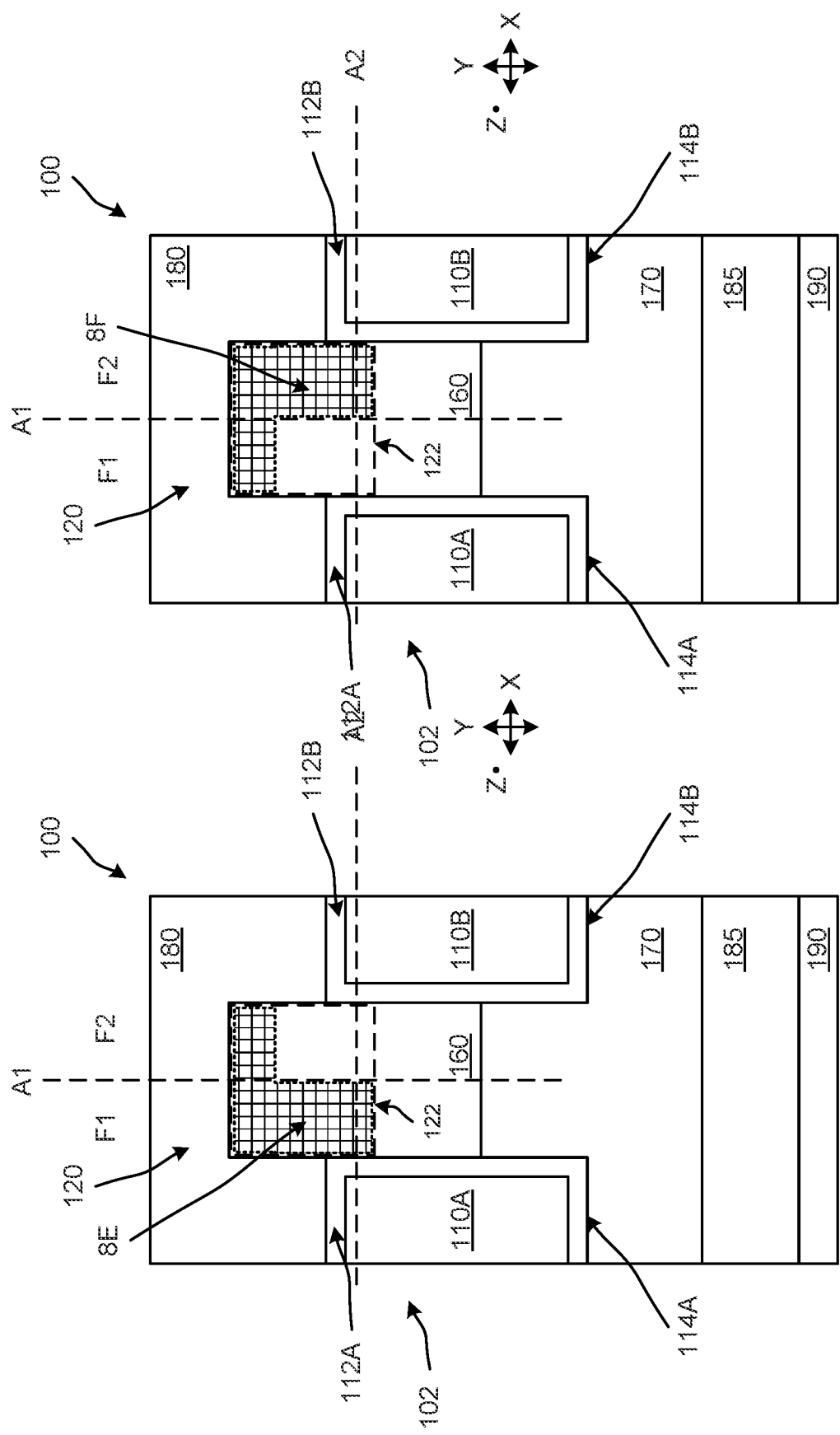

FIG. 8E illustrates a cross section of the upper region 122 that includes the source region segment 8E, which has a first portion that extends vertically along line A1 on side F1 and a second portion that extends horizontally across (e.g., across an entirety of) a top surface of the mesa region 120.

FIG. 8F illustrates a cross section of the upper region 122 that includes the source region segment 8F, which is a version of the source region segment 8E of FIG. 8E mirrored within the upper region 122.

FIG. 8G illustrates a cross section of the upper region 122 that includes the source region segment 8G, which extends across the entirety of the upper region 122. FIG. 8H illustrates a cross section of the upper region 122 that excludes a source region segment. Specifically, the upper region 122 includes only a dopant of the second conductivity type of the body region 160.

As noted above, the cross sections shown in FIGS. 8A through 8H can be combined along a longitudinal axis (z axis) in accordance with variations of the transistor 100 shown in at least FIG. 1. For example, the implementations shown in FIGS. 2 and 3 can be a combination (e.g., an alternating combination) of a source region segment based on the source region segment 8A shown in FIG. 8A and the cross section shown in FIG. 8H. As another example, the implementations shown in FIGS. 4 through 5B can be a combination of alternating source region segments based on the source region segment 8B shown in FIG. 8B and the source region segment 8D shown in FIG. 8D. As another example, the implementation shown in FIG. 6 can be a combination of alternating source region segments based on the source region segment 8A and 8B shown, respectively, in FIGS. 8A and 8B. As yet another example, the implementation shown in FIGS. 7A and 7B can be a combination of cross sections based on the source region segments 8A (FIG. 8A) and 8B (FIG. 8A) with the cross section of FIG. 8H between each of the source region segments 8A and 8B.

The cross sections shown in FIGS. 8A through 8H can be combined along a longitudinal axis (z axis) (e.g., ordered along the longitudinal axis) in accordance with variations of the transistors described herein. The combinations can include various combinations of FIGS. 8A through 8E mixed with combinations of FIGS. 8G and 8H. The combinations of 8G and 8H include: 8G; 8H; 8G and 8H; or 8H and 8G. The combinations of 8G and 8H will be represented below as X in at least the following combinations with 8A through 8E, which can be repeating combinations: 8A+X; 8A+8B; 8A+X+8B; 8C+8D; 8C+X+8D; 8C+X; 8E+8F; 8E+X+8F; 8E+X; 8A+8D; 8A+X+8D; 8A+8F; and/or 8A+X+8F.

Figure 9:
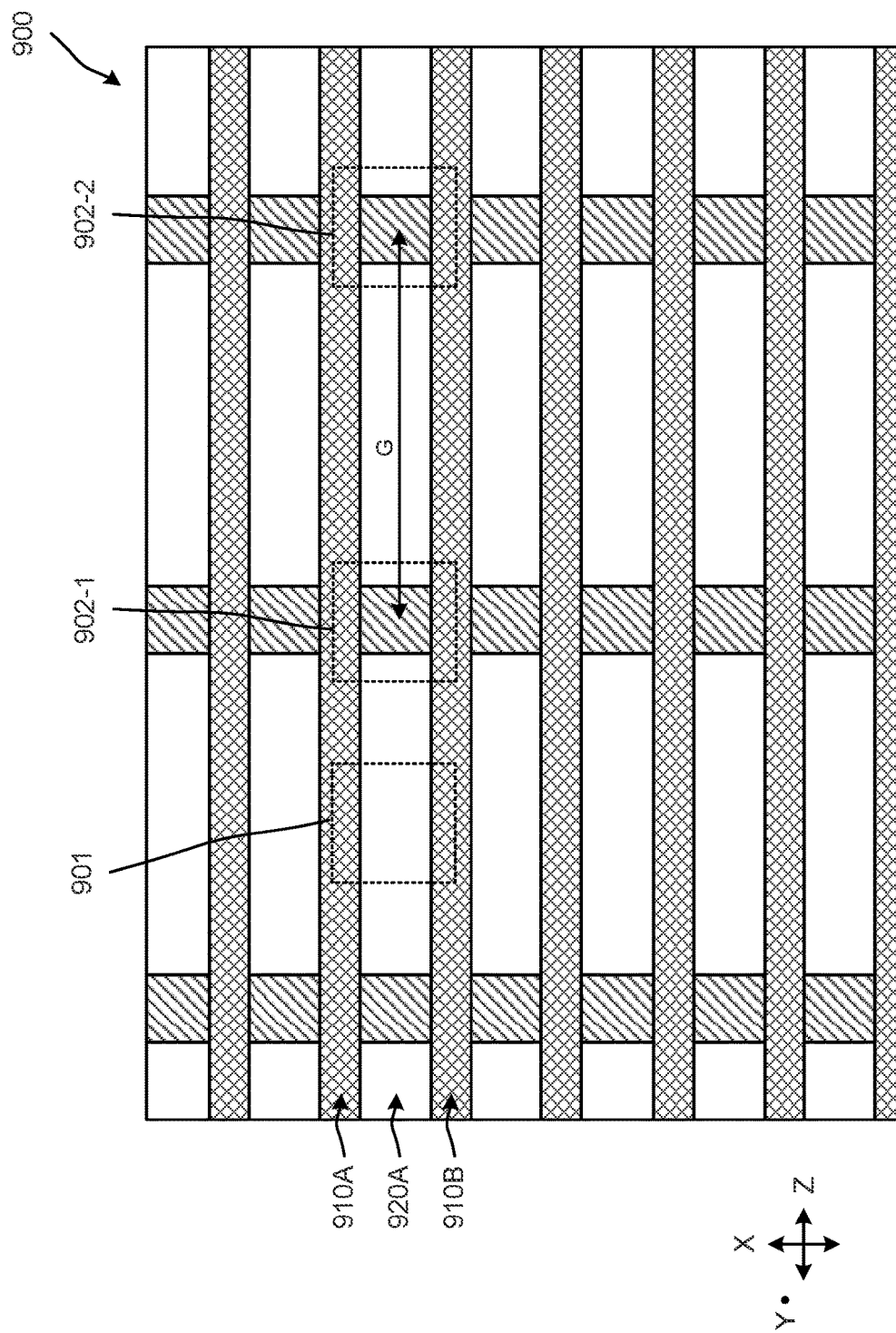
FIG. 9 is an example plan view of a transistor that can include various combinations of transistors and cross sections in FIGS. 1 through 8H.

An example plan view of a transistor 900 that can include various combinations of transistors and cross sections in FIGS. 1 through 8H is illustrated in FIG. 9. As shown in FIG. 9, the transistor 900 can have a device region 901 (e.g., a channel region or active region) and a body contact region 902-1, 902-2 along a mesa 920A (extending along direction Z). Parallel trenches 910A, 910B (also extending along direction Z) are also illustrated in FIG. 9. The cross-sections illustrated in, for example, FIGS. 8A through 8H can be included in various combinations (in various orders) along the length of the mesa 920A. As a specific example, the device region 901 can have the cross-section illustrated in FIG. 8A an 8B.

A body pitch G is also illustrated in FIG. 9. In some implementations, a relatively narrow body pitch G can be implemented to decrease a base resistance of a parasitic NPN bipolar device. In some implementations, the body contacts (e.g., body contact regions 902-1, 902-2) can include doped regions that function as a body contact for the transistor 900. In some implementations, the body contact regions can be at a same potential as the source region.

FIGS. 10A through 10F are diagrams that illustrate a process of making one or more of the transistors as described herein. The processing steps can be performed in an epitaxial layer 1070 formed on, for example, a substrate (not shown). The steps will be discussed generally in terms of an N-type epitaxial layer, but the conductivity types can be reversed for formation in a P-type epitaxial layer.

The process illustrated in connection with FIGS. 10A through 10H are directed to formation of the embodiment of a single-sided body implementation as shown in, for example, FIGS. 4 through 5B. The process illustrated in connection with FIGS. 10A-10C, 10E, and 10F are directed to formation of the embodiment of a double-sided body implementation as shown in, for example, FIGS. 6 through 7B. The single-sided body implementation and/or the double-sided body implementations can be modified based on a body implant option as illustrated and described in connection with at least FIGS. 10G and 10H. These implementations are described in more detail below.

As shown in FIG. 10A, trenches 1014A, 1014B are formed in a semiconductor region 1002 (e.g., the epitaxial layer 1070 of a semiconductor region) of a semiconductor. A mesa 1020 is defined along with the formation of the trenches 1014A, 1014B. The sidewalls of the trenches 1014A, 1014B and a top of the mesa 1020 are lined with a dielectric layer 1004 (e.g., a silicon dioxide layer, a sacrificial oxide, a gate oxide, etc.). Electrodes 1010A, 1010B are formed within the respective trenches 1014A, 1014B using, for example, a polysilicon material (e.g., a polysilicon deposition). The electrodes 1010A, 1010B can be recessed (e.g., have a lower height) relative to a top surface of the mesa 120.

After formation of the dielectric layer 1004, a P-type implant process (e.g., a 2-sided Boron implant at 30 degrees) can be performed (depicted by arrows P1 and P2) as shown in FIG. 10B, to form a P-type region that can at least, in part, form a body region 1060 and a channel region 1063. In some implementations, the implant process can include a 3-step implant process. In some implementations, the 3-step implant process can include one or more 2-sided implant processes. In some implementations, two or more of the 2-sided implant processes can be performed at different energies and/or angles (e.g., 20 degrees, 55 degrees). This 3-step implant process can improve productivity and can result in the elimination of at least some later processing steps.

Figures 10C, 10D:
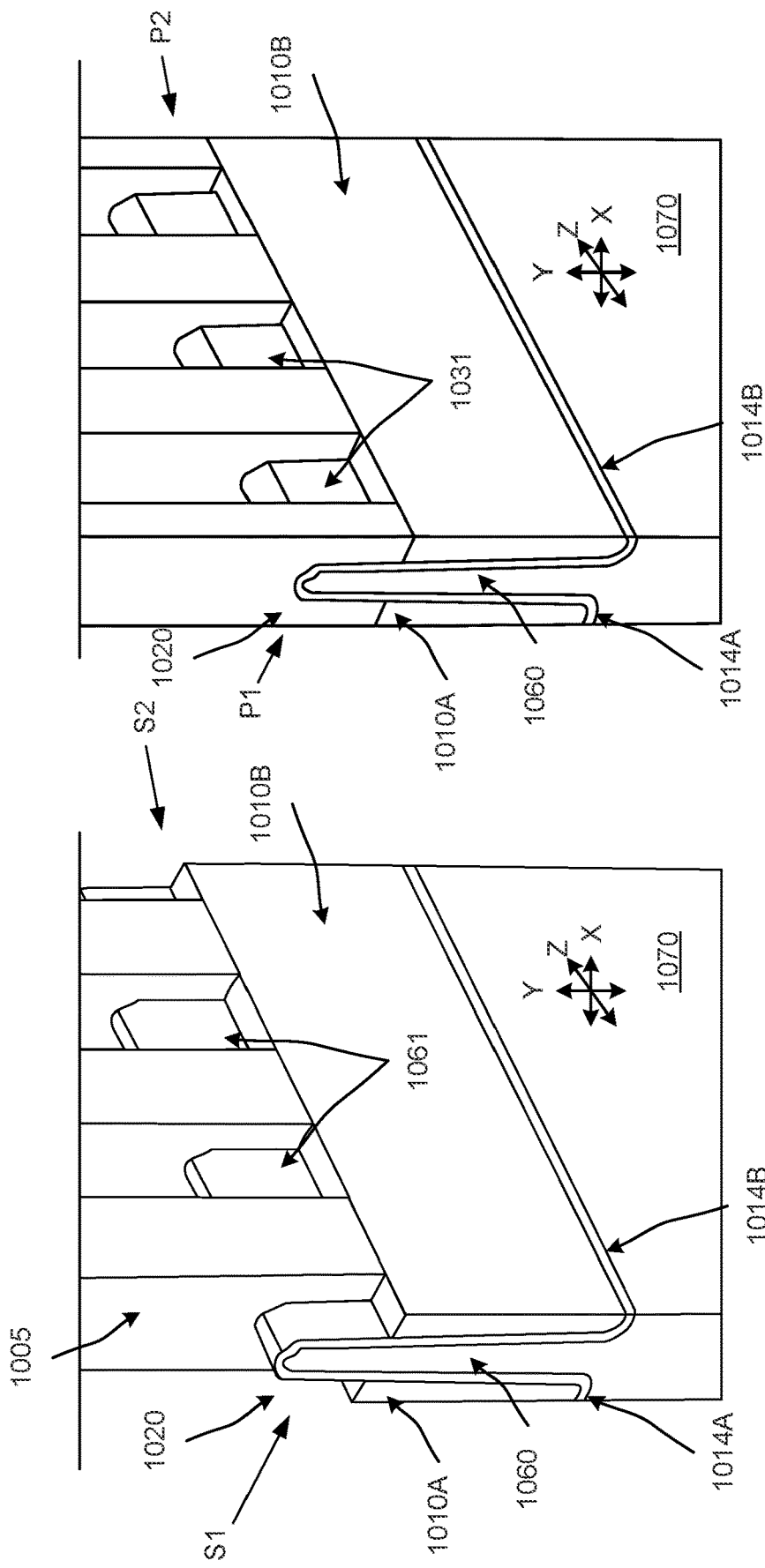

A one-sided N-type implant process (e.g., as part of a first stage Nano Layer Deposition (NLD) (e.g., NLD-1) process) can be performed as shown in FIG. 10C along direction S1 to form at least a part of a continuous source region (e.g., continuous source region 133 shown in FIGS. 4 through 5B). In some implementations, the one-sided N-type implant process can include more than one N-type implant process (e.g., a 1-sided Arsenic implant at 15 degrees and a 1-sided Arsenic implant at 40 degrees). During the one-sided N-type implant process a resist 1005 is applied to block an area where a source region segments 1031 (e.g., source region segments 131 shown in FIGS. 4 through 5B) will be formed (shown in FIG. 10D).

A one-sided P-type implant process (e.g., as part of a first stage Nano Layer Deposition (NLD) (e.g., NLD-1) process) can be performed as shown in FIG. 10C along direction S2 (on an opposite side of the mesa region 1020 related to S1) to form, at least in part, a body region segments 1061 (e.g., source region segments 161 shown in FIGS. 4 through 5B). In some implementations, the one-sided P-type implant process can include one P-type implant process (e.g., a 1-sided Boron implant at 40 degrees). During the one-sided P-type implant process the resist 1005 is applied to block an area where source region segments 1031 will be formed (shown in FIG. 10D). After the NLD-1 process is performed the resist 1005 can be removed (e.g., stripped).

In some implementations, the NLD-1 process can be performed without the one-sided P-type implant process along direction S2. Such implementations can be referred to as a body photo addition process.

As shown in FIG. 10D, a two-sided N-type implant process (e.g., as part of a second stage Nano Layer Deposition (NLD) (e.g., NLD-2) process) can be performed along directions P1 and P2 (which are on opposite sides of the mesa region 1020). The N-type implant process along direction P1 forms another part of the continuous source region (e.g., continuous source region 133 shown in FIGS. 4 through 5B) and the N-type implant process along direction P2 forms the source region segments 1031. One or more of the two-sided N-type implant processes can include, for example, an Arsenic implant at 15 degrees, an Arsenic implant at 40 degrees, and so forth. During the two-sided N-type implant process a resist 1006 is applied to block areas of the body region segments 1061 (e.g., body region segments 161 shown in FIGS. 4 through 5B) as shown in FIG. 10C. After the NLD-2 process is performed the resist 1006 can be removed (e.g., stripped).

In some implementations, the surface area of the mesa region 120 covered by the resist 1005 can be different from the surface area of the mesa region 120 covered by the resist 1005. In some implementations, the surface area of the mesa region 120 covered by the resist 1005 can be mutually exclusive from the surface area of the mesa region 120 covered by the resist 1005. In some implementations, the surface area of the mesa region 120 covered by the resist 1005 can overlap with the surface area of the mesa region 120 covered by the resist 1005. In some implementations, each of the segments of the resist 1005 can be the same length (e.g., equal length) (along the Z direction) of each of the segments of the resist 1006. In some implementations, each of the segments of the resist 1005 can have a length that is less than or greater than (along the Z direction) a length of each of the segments of the resist 1006.

Figure 10F:
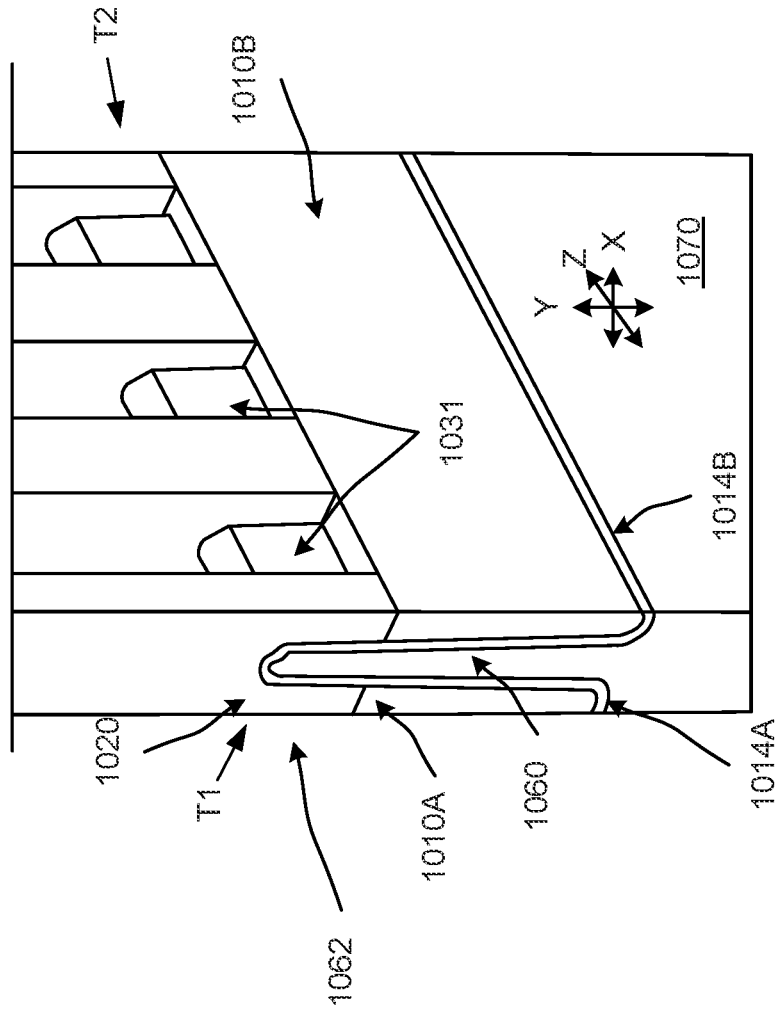
Figure 10E:
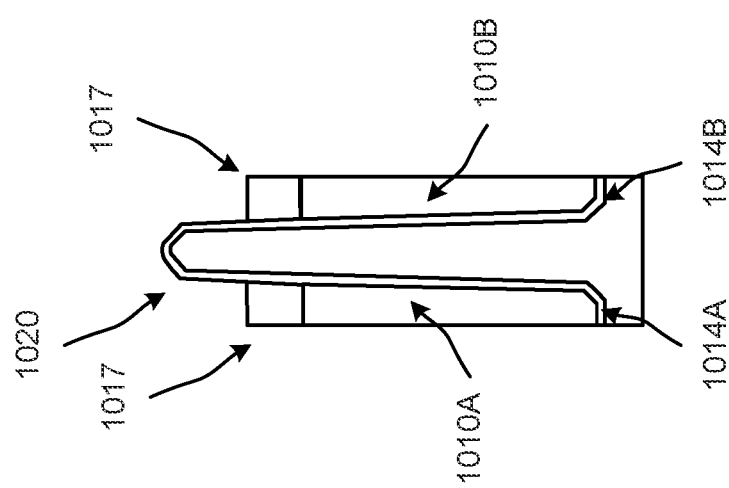

As shown in FIG. 10E, after the resist 1006 has been removed, a dielectric layer 1017 is formed on the transistor. The dielectric layer 1017 can include an inter-layer dielectric, a high temperature oxide deposition, a borophosphosilicate glass (BPSG) deposition, BPSG reflow, and/or so forth. In some implementations, the dielectric layer 1017 can be recessed (e.g., etched (contact etch)) to expose a top surface the mesa region 1020 for source and/or body contacts (not shown) coupled to, for example, the source region segments 1031 and/or the body region segments 1061. As noted above, the process illustrated in FIGS. 10A through 10E can be used to form a single-sided body implementation of the transistor.

As noted above, the process illustrates in FIGS. 10A-10C, 10E, and 10F can be used to form a double-sided body implementation of the transistor (e.g., the double-sided transistor implementation shown in FIGS. 6 through 7B). Specifically, the process shown and described in connection with FIG. 10F can replace the process shown and described in connection with FIG. 10D to form the double-sided body implementation of the transistor.

As shown in FIG. 10F, a one-sided N-type implant process (e.g., as part of a second stage Nano Layer Deposition (NLD) (e.g., NLD-2) process) can be performed along direction T2 (which is on opposite sides of the mesa region 1020 relative to T1). The N-type implant process along direction T2 forms the source region segments 1031. One or more of the one-sided N-type implant processes can include, for example, an Arsenic implant at 15 degrees, an Arsenic implant at 40 degrees, and so forth. During the one-sided N-type implant process a resist 1006 is applied to block areas of the body region segments 1061 (e.g., body region segments 161 shown in FIGS. 6 through 7B) as shown in FIG. 10F.

Also, as shown in FIG. 10F, a one-sided P-type implant process (e.g., as part of a second stage NLD-2 process) can be performed along direction T1 to form, at least in part, body region segments 1062 (e.g., body region segments 162 shown in FIGS. 6 through 7B). Accordingly, the N-type implant process shown in FIG. 10C forms source region segments (e.g., source region segments 132 shown in FIGS. 6 through 7B). After the NLD-2 process is performed the resist 1006 can be removed (e.g., stripped). Also, the processes described in connection with FIG. 10E can be performed after the processes described in connection with FIG. 10F.

FIGS. 10G and 10H are diagrams that illustrate a body implant option that can be combined with any of the embodiment described herein. Specifically, as shown, the size (e.g., volume) of the body region 1060 (or body segment region) is increased in size by one or more body implants that can include, for example, body implants, body masks, etc. In this implementation, a portion 1060A (e.g., portion 160A shown in FIG. 8C) is defined. In some implementations, the portion 1060A can be referred to as a body contact enhancement.

In the case of a single-sided transistor, the body implant option can include a body photo/mask step and a one-sided body implant (e.g., P-type implant) at 40 degrees. The body implant can be performed to expand the size (e.g., volume) of one or more body region segments.

In the case of a double-sided transistor, the body implant option can include a first body photo/mask step, a first one-sided body (e.g., P-type) implant at 40 degrees on a first side of the mesa region 1020 associated with a first set of body region segments, a second body photo/mask step, and a second one-sided body (e.g., P-type) implant at 40 degrees on a second side of the mesa region 1020 associated with a second set of body region segments.

In some implementations, the one-sided P-type implant process along direction T1 (shown in FIG. 10F) associated with NLD-2 can be omitted when implementing the body implant option for the double-sided body transistor implementation.

Figure 11:
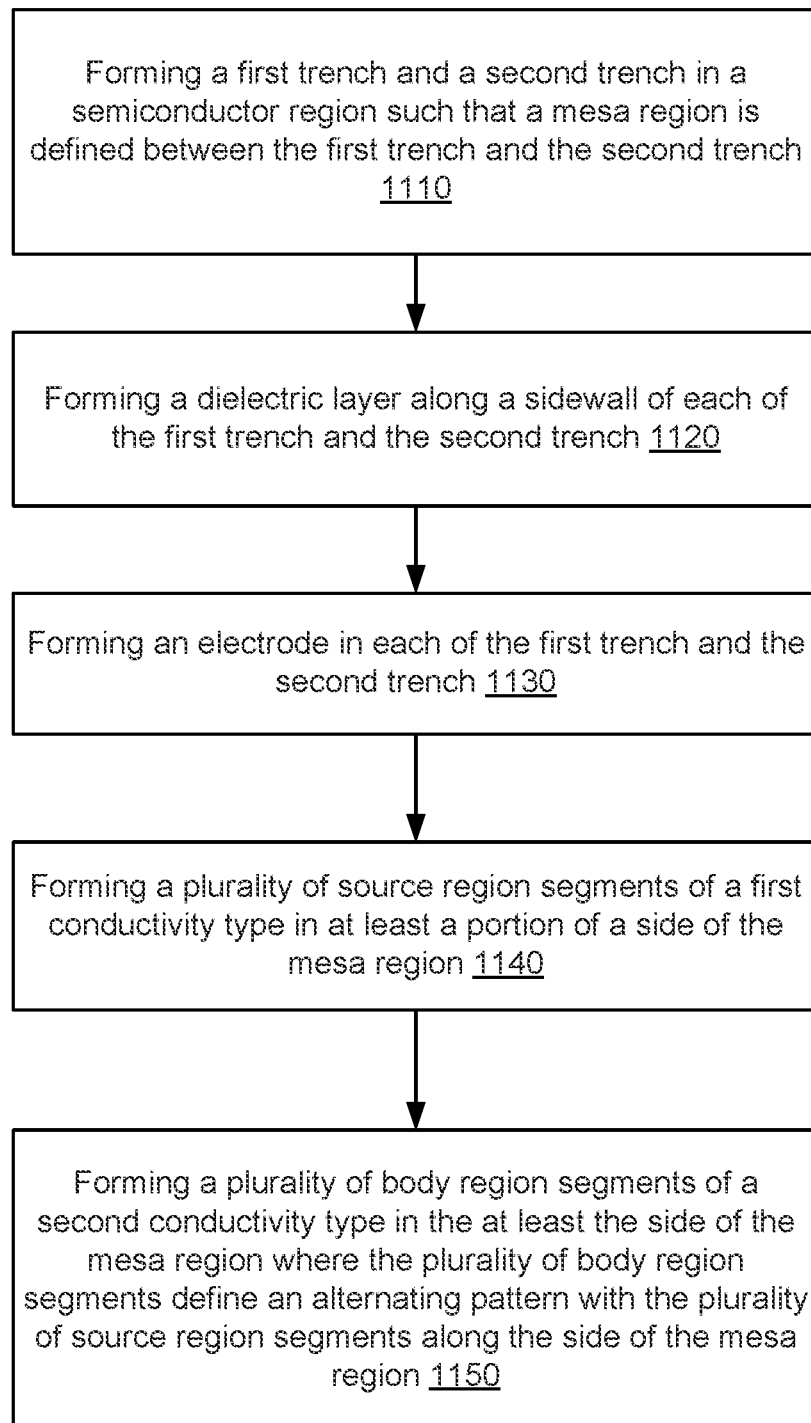
FIG. 11 is a flowchart illustrating a method of forming a transistor.

FIG. 11 is a flowchart illustrating a method of forming a transistor, according to an implementation. The flowchart illustrated in FIG. 11 can be used to form (e.g., manufacture) one or more of the transistor implementations described herein.

The method can include forming a first trench and a second trench in a semiconductor region such that a mesa region is defined between the first trench and the second trench (block 1110). In some implementations, the mesa region can be less than a micron in width.

A dielectric layer can be formed along a sidewall of each of the first trench and the second trench (block 1120), and an electrode can be formed in each of the first trench and the second trench (block 1130). The electrode can be a gate electrode and can include, for example, a poly silicon material.

A plurality of source region segments of a first conductivity type formed in at least a portion of a side of the mesa region (block 1140). In some implementations, the plurality of source region segments are formed using a first mask.

A plurality of body region segments of a second conductivity type are formed in the at least the side of the mesa region where the plurality of body region segments define an alternating pattern with the plurality of source region segments along the side of the mesa region (block 1150). In some implementations, the plurality of source region segments are formed using a second mask. In some implementations, the second mask can cover an area where at least a portion of the plurality of source region segments are formed. In some implementations, the first mask can cover an area where at least a portion of the plurality of body region segments are formed. Any of the options described in connection with at least FIGS. 10A through 10H can be included in this method.

Figure 12:
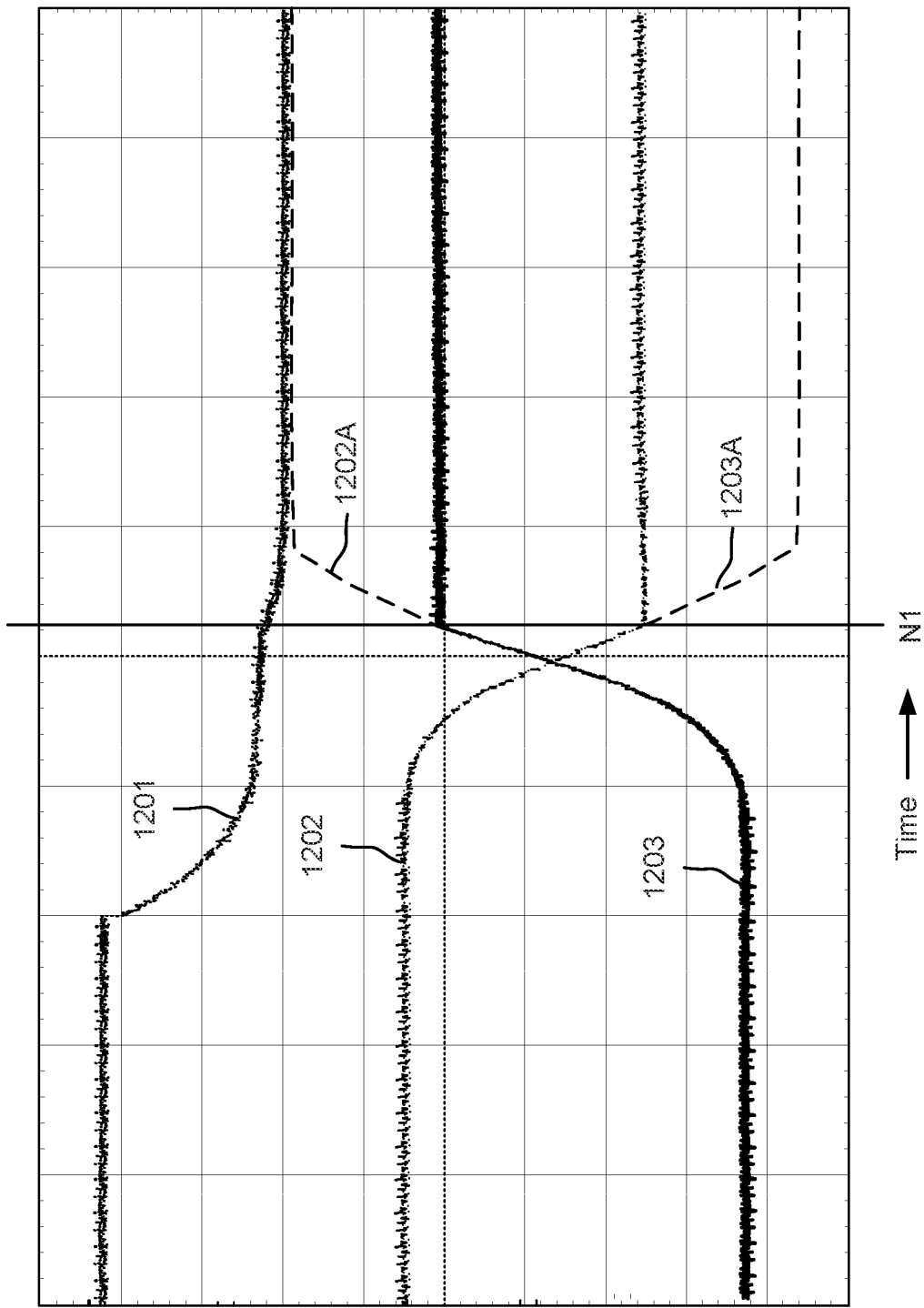
FIG. 12 is a graph that illustrates a latch-up scenario of a transistor.

FIG. 12 is a graph that illustrates a latch-up scenario of a transistor. As shown in FIG. 12, as a gate voltage 1201 (in V/div) and a transistor current 1202 (in A/div) decreases over time, a source voltage 1203 increases. However, at approximately time N1, the source voltage 1203 (in V/div) does not continue to an expected source voltage 1203A (shown with a dashed line) when the transistor is off, and the transistor current 1202 does not continue to an expected transistor current of 0 when the transistor is off (also shown with a dashed line). The latch-up condition prevents the source voltage 1203 from achieving the expected source voltage 1203A and the transistor current 1202 from continuing to an expected transistor current of 0 when the transistor is off.

Figure 13:
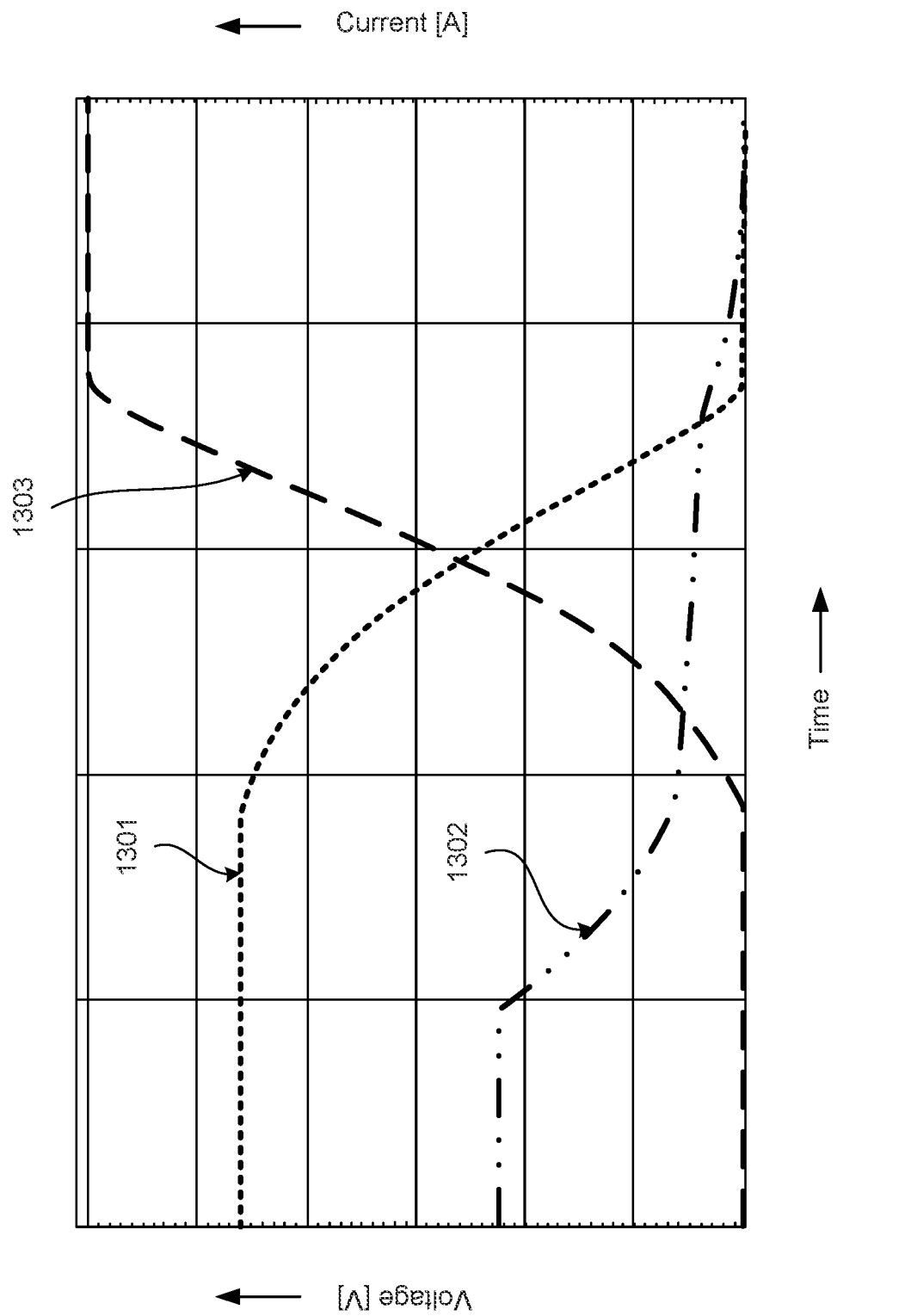
FIG. 13 is a graph that illustrates operation of a transistor in accordance with the implementations described herein.

FIG. 13 is a graph that illustrates operation of a transistor in accordance with the implementations described herein. As shown in FIG. 13, as gate voltage 1302 decreases, a drain voltage 1303 rises as expected and a drain current 1301 decreases to zero.

Figure 14:
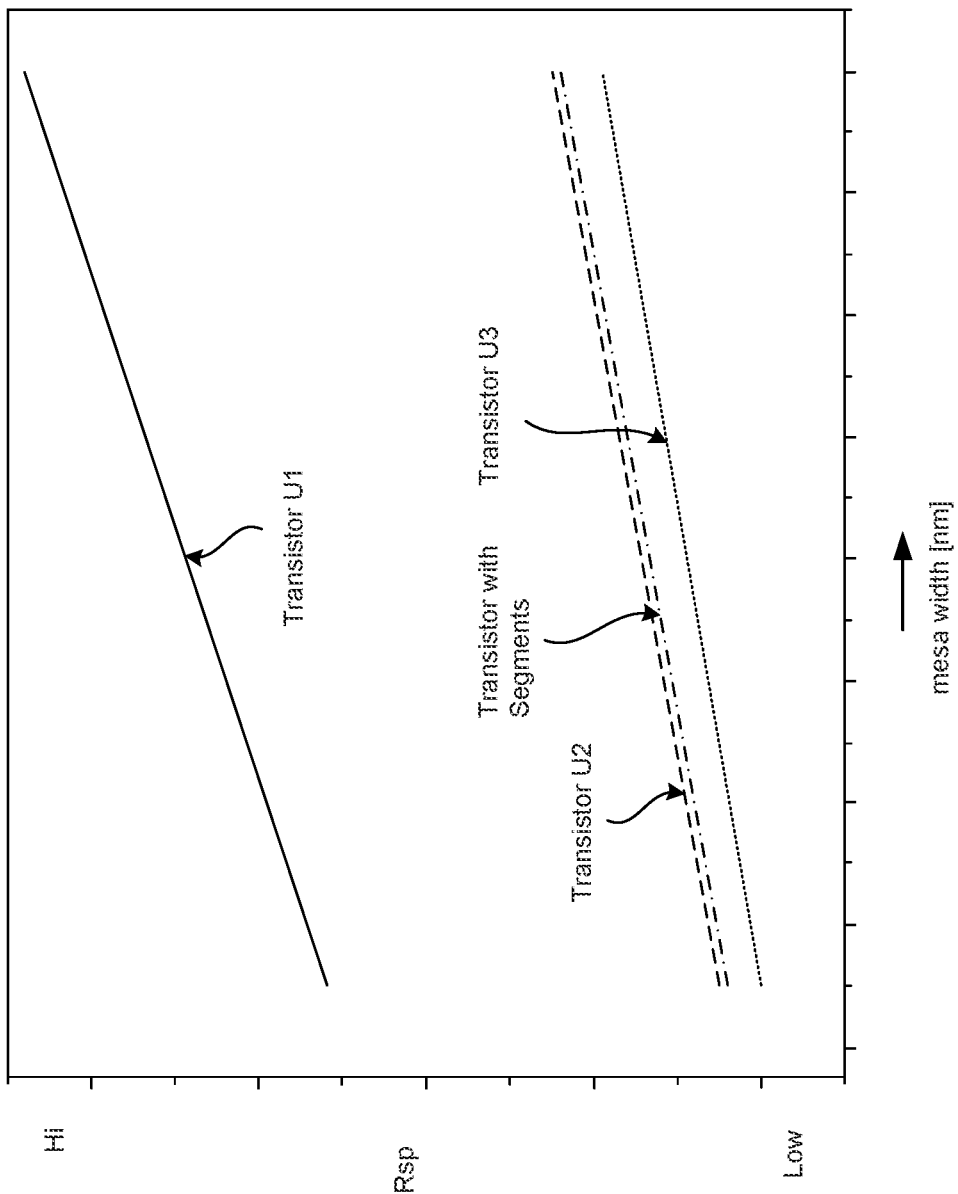
FIGS. 14 and 15 are graphs that illustrate characteristics of a transistor with segments, as described herein, as compared with other transistors.
Figure 15:
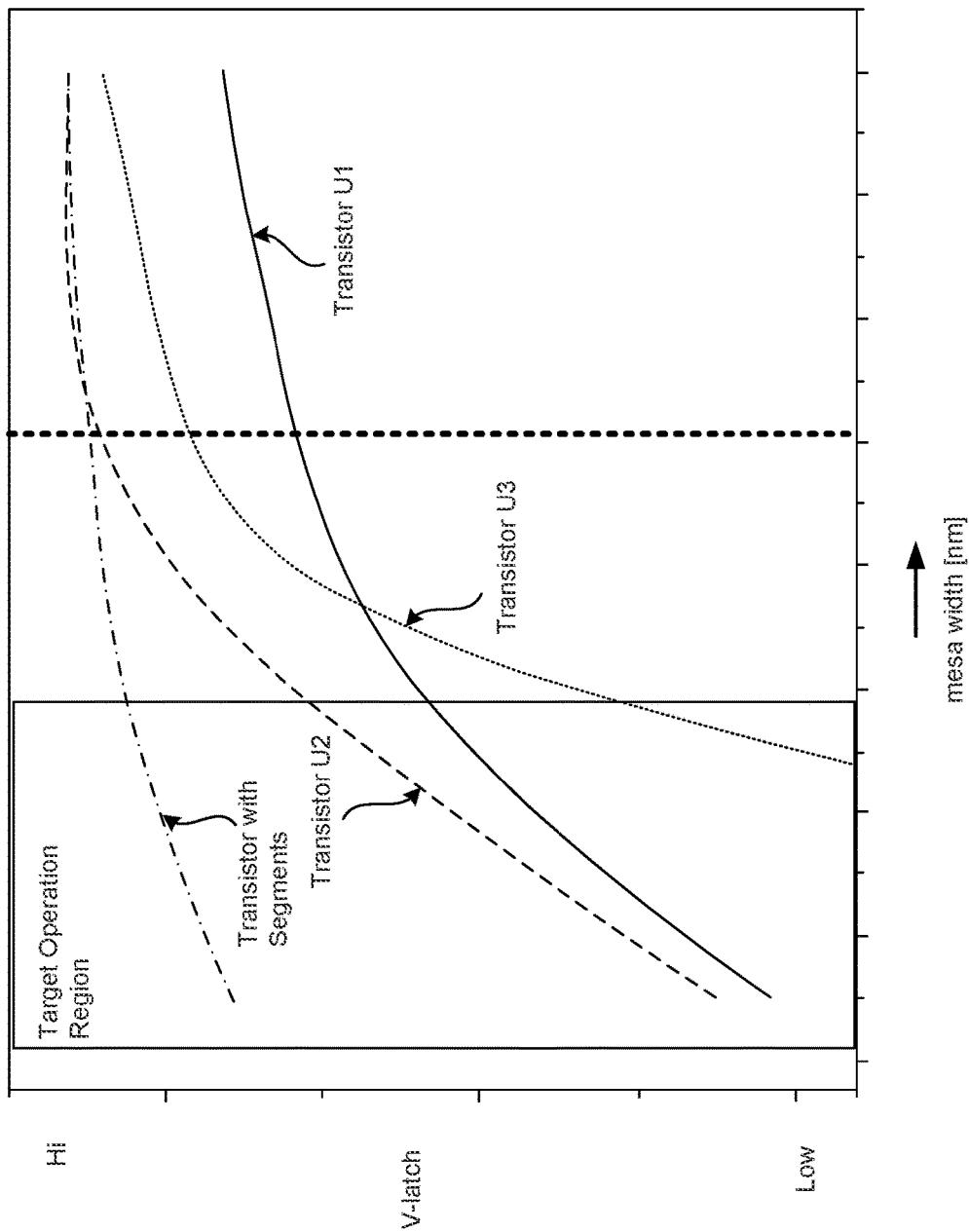

FIGS. 14 and 15 are graphs that illustrate characteristics of a transistor with segments (e.g., source region segments and body region segments) as described herein as compared with other transistors (e.g., transistors U1 through U3). FIGS. 14 and 15 illustrate on-resistance (Rsp) and V-latch robustness, respectively, versus mesa width (along the x-axis). As shown in FIG. 14, the on-resistance is relatively low for the transistor with segments at relatively small mesa widths. As shown in FIG. 15, the transistor with segments is relatively robust against V-latch even with relatively small mesa widths (e.g., in a target operation region between nm 80 to 140 nm mesa width). Specifically V-latch performance of the implementations described herein, which include source region segments and/or body region segments, can be at least 10% greater than V-latch performance of the implementations excluding source region segments and/or body region segments.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   a first trench disposed in a semiconductor region and including a gate electrode;
   a second trench disposed in the semiconductor region;
   a mesa region disposed between the first trench and the second trench, the mesa region having a length aligned along a longitudinal axis orthogonal to a vertical axis aligned along a height of the mesa region;
   a source region segment of a first conductivity type disposed in a first side of the mesa region, the source region segment being included in a plurality of source region segments, the plurality of source region segments being aligned along the longitudinal axis; and
   a body region segment of a second conductivity type disposed in a second side of the mesa region opposite the first side of the mesa region and having a portion disposed above the source region segment, the body region segment being included in a plurality of body region segments, the plurality of body region segments being aligned along the longitudinal axis.

2. The apparatus of claim 1, wherein the source region segment is a first source region segment of the plurality of source region segments, the body region segment is a first body region segment of the plurality of body region segments,
   the apparatus further comprising:
   a second source region segment disposed on the second side of the mesa region; and
   a second body region segment disposed on the first side of the mesa region and having a portion disposed above the second source region segment.

3. The apparatus of claim 2, further comprising:
   a third source region segment extending to a top of the mesa region and across a width of the mesa region.

4. The apparatus of claim 2, further comprising:
   a third body region segment extending to a top of the mesa region and across a width of the mesa region, the third body region segment being aligned along the longitudinal axis at a location from the first source region segment.

5. The apparatus of claim 1, wherein the source region segment is a first source region segment of the plurality of source region segments,
   the apparatus further comprising:
   a second source region segment extending to a top of the mesa region.

6. The apparatus of claim 5, further comprising:
   a third source region segment extending to a top of the mesa region and across a width of the mesa region.

7. The apparatus of claim 5, wherein the body region segment is a first body region segment of the plurality of body region segments,
   the apparatus further comprising:
   a second body region segment extending to a top of the mesa region and across a width of the mesa region, the second body region segment being aligned along the longitudinal axis at a location separate from the first source region segment.

8. The apparatus of claim 1, wherein the source region segment is a first source region segment of the plurality of source region segments,
   the apparatus further comprising:
   a second source region segment extending to a top of the mesa region and across a width of the mesa region.

9. The apparatus of claim 1, wherein each source region segment of the plurality of source region segments is separated from another of the plurality of source region segments by a body region segment from the plurality of body region segments.

10. The apparatus of claim 1, wherein each body region segment of the plurality of body region segments is connected to a channel region disposed between the first trench and the second trench.

11. The apparatus of claim 10, wherein the channel region is disposed below the plurality of body region segments.

12. The apparatus of claim 1, wherein the plurality of source region segments are a first plurality of source region segments,
    the apparatus further comprising:
    a second plurality of source region segments disposed on the second side of the mesa region.

13. The apparatus of claim 1, wherein the plurality of body region segments are a first plurality of body region segments, the plurality of source region segments are a first plurality of source region segments,
    the apparatus further comprising:
    a second plurality of body region segments disposed on the second side of the mesa region.

14. The apparatus of claim 1, wherein the plurality of body region segments are a first plurality of body region segments, the plurality of source region segments are a first plurality of source region segments,
    the apparatus further comprising:
    a second plurality of body region segments disposed on the second side of the mesa region, the second plurality of body region segments alternating with a second plurality of source region segments along the second side of the mesa region.

15. The apparatus of claim 1, further comprising:
a source conductor in contact with the source region segment and defining an Ohmic contact.

16. An apparatus, comprising:
a first trench disposed in a semiconductor region and including a gate electrode;
a second trench disposed in the semiconductor region;
a mesa region disposed between the first trench and the second trench, the mesa region having a length aligned along a longitudinal axis orthogonal to a vertical axis aligned along a height of the mesa region;
a source region segment of a first conductivity type disposed in a side of the mesa region, the source region segment being included in a plurality of source region segments,
a body region segment of a second conductivity type disposed in the mesa region and having a portion extending across a width of the mesa region, the body region segment being included in a plurality of body region segments, the plurality of body region segments being aligned along the longitudinal axis.

17. The apparatus of claim 16, wherein the source region segment extends to a top of the mesa region.

18. The apparatus of claim 16, wherein the plurality of body region segments are a first plurality of body region segments, the side of the mesa region is a first side of the mesa region, the plurality of source region segments are a first plurality of source region segments, the apparatus further comprising:
a second plurality of body region segments disposed on a second side of the mesa region opposite the first side of the mesa region, the second plurality of body region segments alternating with a second plurality of source region segments along the second side of the mesa region.

19. An apparatus, comprising:
a first trench disposed in a semiconductor region and including a gate electrode;
a second trench disposed in the semiconductor region;
a mesa region disposed between the first trench and the second trench, the mesa region having a length aligned along a longitudinal axis orthogonal to a vertical axis aligned along a height of the mesa region;
a first source region segment of a first conductivity type disposed in a first side of the mesa region, the first source region segment being included in a plurality of source region segments;
a body region segment of a second conductivity type disposed in a second side of the mesa region opposite the first side of the mesa region, the body region segment being included in a plurality of body region segments, the plurality of body region segments being aligned along the longitudinal axis; and
a second source region segment disposed in the mesa region and having a portion extending across a width of the mesa region.

20. The apparatus of claim 19, wherein the second source region segment extends to a top of the mesa region.

* * * * *